United States Patent
Terui

(10) Patent No.: US 7,632,711 B2
(45) Date of Patent: Dec. 15, 2009

(54) FABRICATION METHOD FOR CHIP SIZE PACKAGE AND NON-CHIP SIZE PACKAGE SEMICONDUCTOR DEVICES

(75) Inventor: Makoto Terui, Yamana (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/368,614

(22) Filed: Mar. 7, 2006

(65) Prior Publication Data

US 2006/0157845 A1    Jul. 20, 2006

Related U.S. Application Data

(62) Division of application No. 10/722,561, filed on Nov. 28, 2003, now Pat. No. 7,012,339.

(30) Foreign Application Priority Data

Nov. 28, 2002    (JP)    ............................. 2002-346256

(51) Int. Cl.
*H01L 21/00*    (2006.01)

(52) U.S. Cl. ........................ 438/110; 438/113; 257/786; 257/E21.001

(58) Field of Classification Search ................. 257/787, 257/690, 692, 734, 738, 531, 532, 773, 776, 257/100, 433, 687, 739, 786, E21.001; 438/110, 438/113

See application file for complete search history.

(56) References Cited

U.S. PATENT DOCUMENTS

| 5,557,148 | A | * | 9/1996 | Cain | ........................... 257/777 |
| 6,228,684 | B1 | * | 5/2001 | Maruyama | .................. 438/113 |
| 6,391,685 | B1 | | 5/2002 | Hikita et al. | |
| 6,504,096 | B2 | * | 1/2003 | Okubora | ...................... 174/521 |
| 2001/0042901 | A1 | * | 11/2001 | Maruyama | .................. 257/620 |
| 2002/0074146 | A1 | * | 6/2002 | Okubora | .................... 174/52.2 |
| 2002/0149086 | A1 | * | 10/2002 | Aoki | ........................... 257/528 |
| 2003/0189251 | A1 | * | 10/2003 | Terui et al. | .................. 257/738 |

FOREIGN PATENT DOCUMENTS

| JP | 9-64049 | 3/1997 |
| JP | 2000-243900 | 9/2000 |
| JP | 2000-299406 | 10/2000 |

* cited by examiner

*Primary Examiner*—Thanh V Pham
*Assistant Examiner*—Jami M Valentine
(74) *Attorney, Agent, or Firm*—Rabin & Berdo, P.C.

(57) ABSTRACT

When an integrated circuit is formed in a semiconductor wafer, the integrated circuit is formed only in the central part of each chip region. In a case where packaging other than a chip size package is made, only the central part in which the integrated circuit is formed is cut from the wafer. In a case where a chip size package is made, the chip region is cut from the wafer after forming the redistribution wiring and external terminals and so forth over the whole of the chip region. As a result, the design of the integrated circuit and part of the fabrication process thereof can be shared by a chip which is mounted in a chip size package and a chip which is mounted in another type of package.

16 Claims, 20 Drawing Sheets

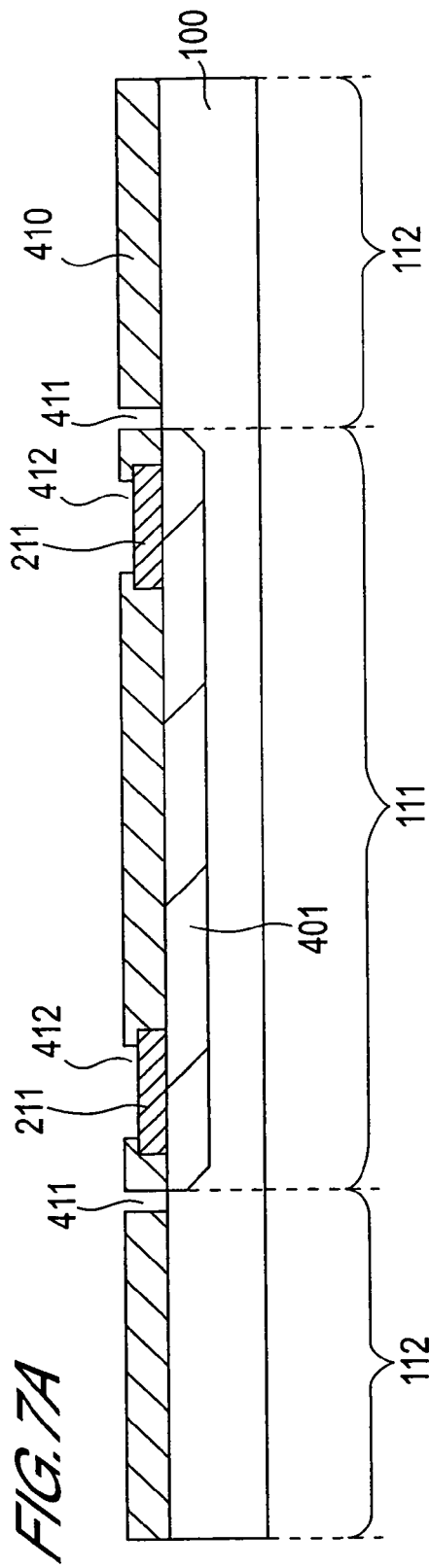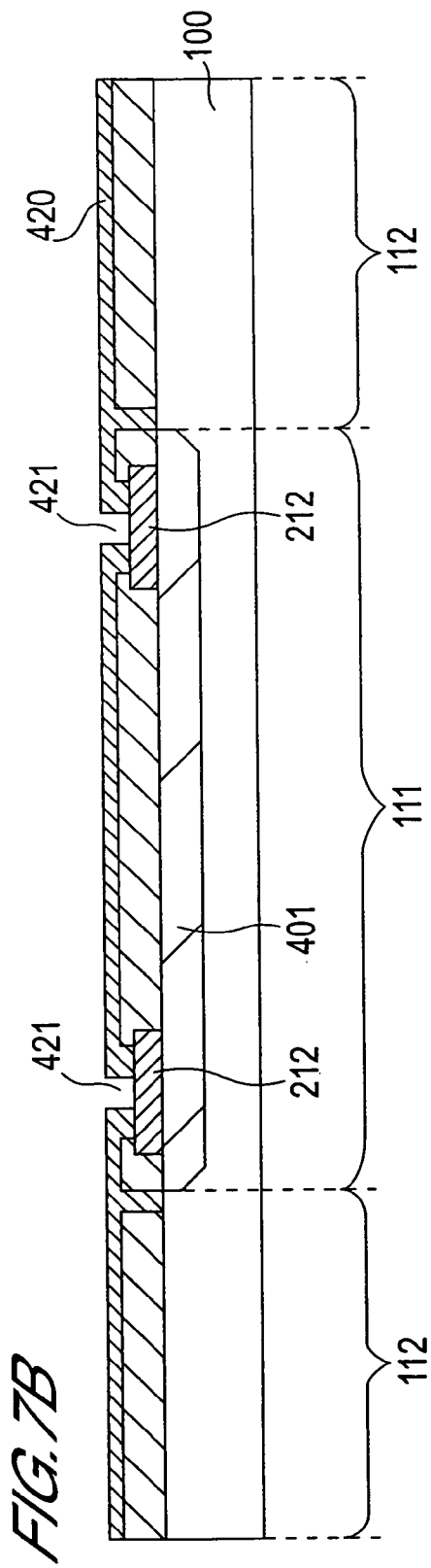

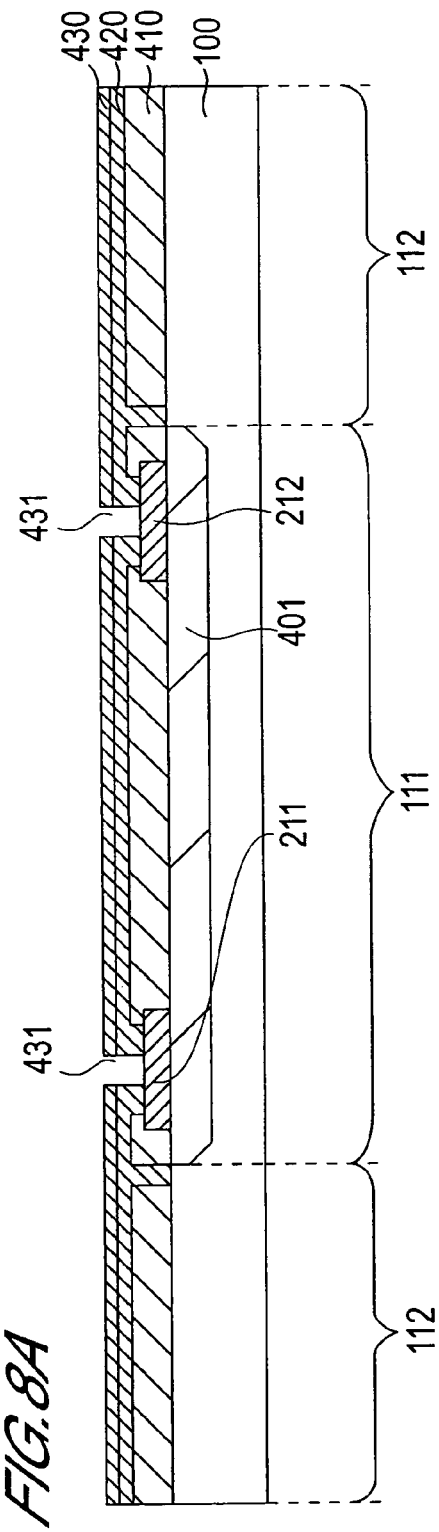
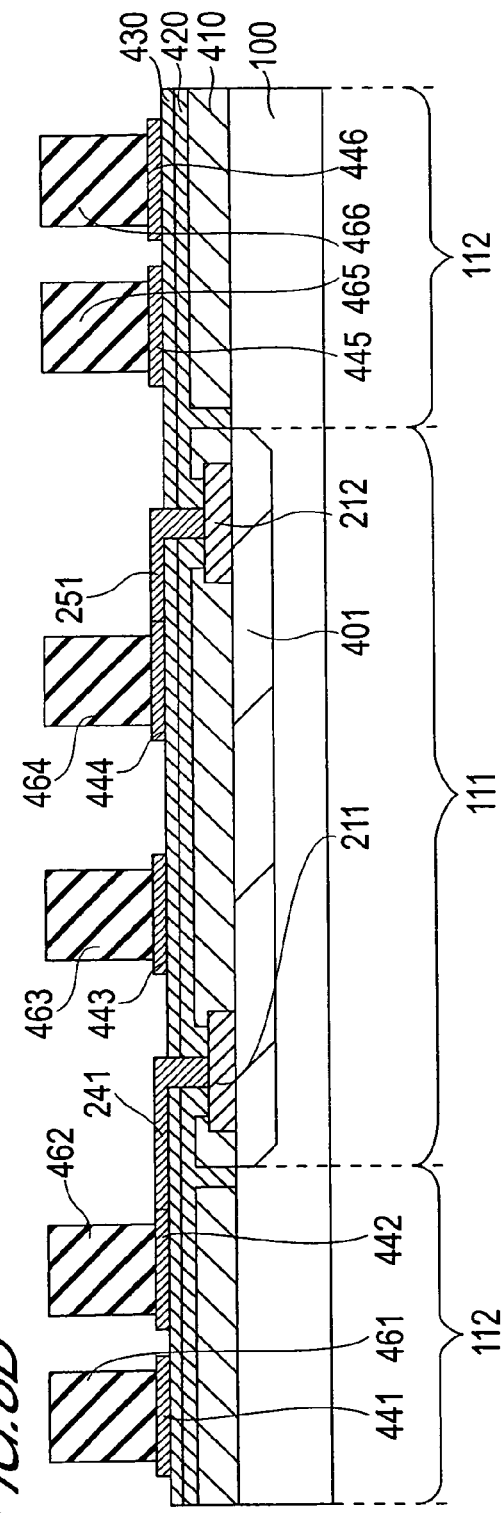
FIG.8A
FIG.8B

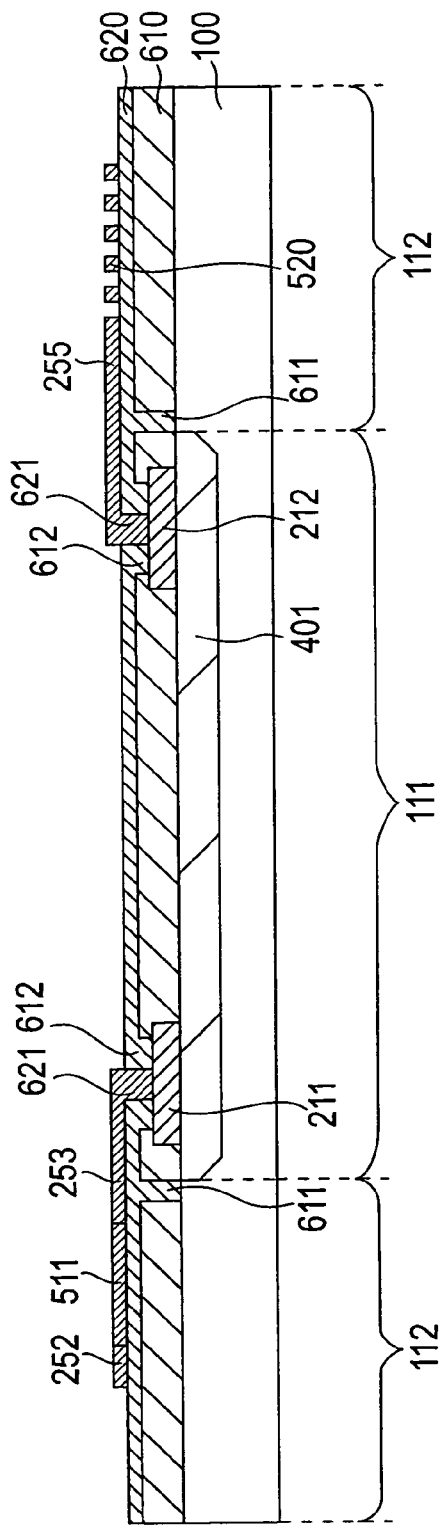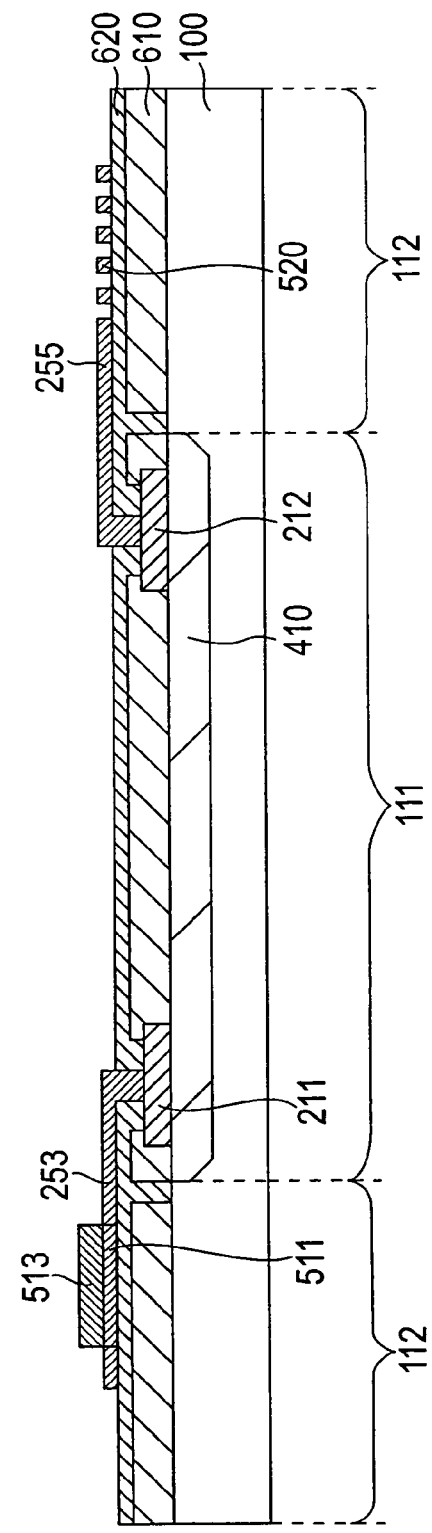

FABRICATION METHOD FOR CHIP SIZE PACKAGE AND NON-CHIP SIZE PACKAGE SEMICONDUCTOR DEVICES

This is a Divisional of U.S. Application Ser. No. 10/722,561, filed Nov. 28, 2003, now U.S. Pat. No. 7,012,339 issued Mar. 14, 2006.

BACKGROUND OF THE INVENTION

1. Field of the Invention

The present invention relates to a semiconductor device.

2. Description of Related Art

CSPs (Chip Size Packages) are known as semiconductor chip package structures. The adoption of a CSP makes it possible to make the size of the package substantially the same as the chip cut from the semiconductor wafer.

WCSPs, which constitute one type of CSP, are known. Japanese Patent No. 3313547, for example, is known as a publication that discloses a WCSP.

A WCSP structure comprises a redistribution wiring layer which is provided on the surface on which the integrated circuit is formed. External terminals, that is, input/output pins, are provided on the redistribution wiring layer. The redistribution wiring layer comprises wiring for connecting external terminals to the pads of the integrated circuit. In the above-mentioned publication, solder balls are employed as the external terminals. The surface on which the external terminals are formed is called the 'mount face' and a structure in which external terminals are provided on a mount face is known as a 'fan-in structure'.

The maximum number of external terminals which can be provided on the mount face is determined by the pitch of the external terminals and the size of the mount face. In other words, in order to increase the quantity of external terminals provided on the mount face, the pitch of the external terminals must be reduced or the mount face must be increased in size.

In many cases, the pitch of the external terminals is designated by the user of the semiconductor device. In cases where the pitch is designated beforehand, it is not possible to increase the number of terminals by reducing the pitch. In addition, the reduction in pitch is subject to fabrication technology limitations.

On the other hand, in a case where the size of the mount face is increased, although the chip area is then larger, the maximum number of external terminals which can be provided on the mount face can be optionally set. In order to increase the size of the mount face, the degree of integration of the integrated circuit may be reduced.

In a case where the degree of integration of the integrated circuit formed in the semiconductor chip is reduced, it is undesirable to use this semiconductor chip for fabricating a semiconductor device with a package structure other than a WCSP structure (a wire bonding structure, for example). This is because, when wire bonding structure packaging or other non-WCSP packaging is performed on a semiconductor chip with a small degree of integration, the size of the semiconductor device is then abnormally large. Therefore, even when the logic structure of the integrated circuit is the same, a chip mounted on the WCSP and a chip mounted on another type of package should be designed separately and fabricated by means of a separate process. For this reason the design and fabrication process cannot be shared, and so the fabrication costs are extremely high.

SUMMARY OF THE INVENTION

A object of the present invention is to provide a technique for increasing the maximum number of external terminals being provided on the mount face of a semiconductor device that adopts a WCSP structure, without incurring a cost increase.

The semiconductor device according to the first standpoint of the present invention comprises: a semiconductor chip which has a circuit region defined in the central part thereof and a wiring region which surrounds the circuit region; an integrated circuit which is formed on the circuit region; a plurality of electrode pads which are formed on the circuit region and which are connected to the integrated circuit; a plurality of first external terminals which are arranged over the circuit region; a plurality of second external terminals which are arranged over the wiring region; a first redistribution wiring which connects the electrode pad to the first external terminal; a second redistribution wiring which connects the electrode pad to the second external terminal; and a sealing film which covers over the circuit region and the wiring region such that the first and second external terminals are exposed from the sealing film.

The semiconductor device according to the first standpoint of the present invention comprises a wiring region for providing second redistribution wiring and second external terminals. Therefore, the quantity of external terminals can be increased without reducing the rate of integration of the integrated circuit. Moreover, because the rate of integration of the integrated circuit is not reduced, the integrated circuit design can be shared by a chip mounted in a WCSP and a chip mounted in other type of package, and therefore the sharing of part of the fabrication process is then straightforward.

The semiconductor device according to the second standpoint of the present invention comprises: a semiconductor substrate which has a first region that is provided with a plurality of circuit element connection pads, and a second region that surrounds the first region; a plurality of first external terminals which are arranged on the first region; a plurality of second external terminals which are arranged on the second region; a plurality of first wiring structures which are formed on the first region, and electrically and individually connecting a plurality of the first external terminals and a first predetermined number of the circuit element connection pads; a plurality of second wiring structures which are formed ranging from the first region to the second region, and electrically and individually connecting a plurality of the second external terminals and a second predetermined number of the circuit element connection pads; a passive element which is electrically connected to one of the second wiring structures.

The semiconductor device according to the second standpoint of the present invention comprises a second region for providing second redistribution wiring structures and second external terminals. Therefore, the quantity of external terminals can be increased without reducing the rate of integration of the integrated circuit. Moreover, because the rate of integration of the integrated circuit is not reduced, the integrated circuit design can be shared by a chip mounted in a WCSP and a chip mounted in other type of package, and therefore the sharing of part of the fabrication process is then straightforward.

The semiconductor device according to the present invention can fabricate using a fabrication described hereinafter.

The semiconductor device fabrication method performs a common process in which an integrated circuit having a plurality of electrode pads is formed in a circuit region established in the central part of each integrated circuit formation region of a semiconductor wafer, and then, in a case where a chip size package semiconductor device is fabricated, the fabrication method performs a first separate process comprising: (a) forming first redistribution wiring, one end of which is connected to the electrode pads, in the circuit region, and forming second redistribution wiring, one end of which is connected to the electrode pads, in a wiring region which is established so as to surround the circuit region; (b) forming first external terminals, which are connected to the other end of the first redistribution wiring, in the circuit region, and forming second external terminals, which are connected to the other end of the second redistribution wiring, in the wiring region; (c) forming a sealing film which covers the circuit region and the wiring region such that the first external terminals and the second external terminals are exposed; and (d) finishing the semiconductor device by dicing the semiconductor wafer along the outer edge of the wiring region, and, in a case where a semiconductor device other than a chip size package semiconductor device is fabricated, the fabrication method performs a second separate process comprising: (e) creating semiconductor chips by dicing the semiconductor wafer along the outer edge of the circuit region; and (f) finishing the semiconductor device by subjecting the semiconductor chip to predetermined packaging.

According to this semiconductor device fabrication method, an integrated circuit is formed in only a circuit region which is established in the central part of a chip region of the semiconductor wafer (a region for a single chip produced by dicing). Further, second redistribution wiring and first external terminals are formed at the perimeter of the circuit region, that is, in the wiring region, only when a chip size package is adopted. Therefore, the integrated circuit design and part of the fabrication process can be shared by the chip mounted in a WCSP and a chip mounted in another type of package.

Regarding this fabrication method, it is desirable that the first separate process comprises forming passive elements for regulating the electrical characteristics of the second redistribution wiring in the wiring region.

Regarding this fabrication method, it is desirable that the passive elements include a capacitor.

Regarding this fabrication method, it is desirable that the passive elements include a plurality of capacitors which are standardized so as to have the same size and the same characteristics.

Regarding this fabrication method, it is desirable that the passive elements include an inductor.

Regarding this fabrication method, it is desirable that the passive elements include a plurality of inductors which are standardized so as to have the same size and the same characteristics.

Regarding this fabrication method, it is desirable that plurality of the passive elements is arranged in the form of an array in the wiring region.

Regarding this fabrication method, it is desirable that the passive elements are formed in the layer in which the second redistribution wiring is provided.

Regarding this fabrication method, it is desirable that the passive elements are formed in a layer that lies beneath the layer in which the second redistribution wiring is provided.

Regarding this fabrication method, it is desirable that the electrode pads are arranged along the boundary between the circuit region and the wiring region.

BRIEF DESCRIPTION OF THE DRAWINGS

Other objects and advantages of the present invention are described with reference to the attached drawings below.

FIGS. 7A, 7B, 8A, 8B, and 9 are outline cross-sectional views that serve to illustrate the fabrication process of the semiconductor device shown in FIGS. 3 and 4;

FIGS. 10A, 10B, 11A, 11B, and 12 are outline cross-sectional views that serve to illustrate the fabrication process of the semiconductor device shown in FIGS. 5A, 5B, and 6;

DESCRIPTION OF THE PREFERRED EMBODIMENTS

Embodiments of the present invention will be described below with reference to the drawings. The drawings merely provide an outline view of the size, shape and dispositional relationship of the constituent components to an extent permitting an understanding of the invention, and the numerical conditions described below are merely a simple illustration.

First Embodiment

The first embodiment of the present invention will be described below.

Figure 1A:
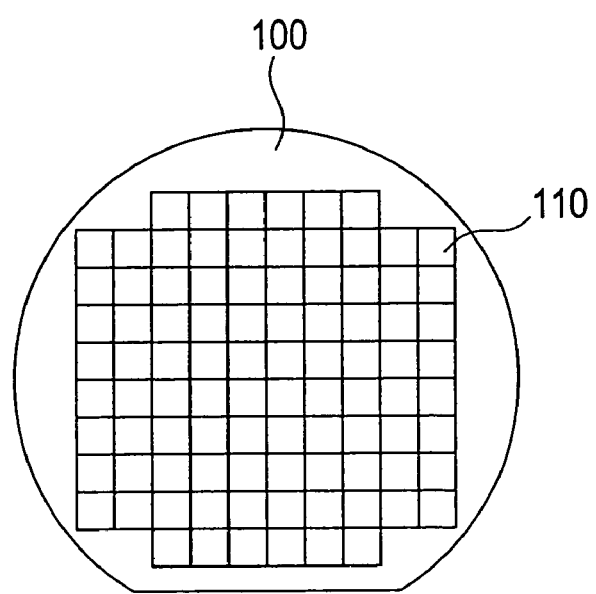
FIG. 1A is a planar view conceptually showing the structure of the semiconductor wafer according to this embodiment.

FIG. 1A is a planar view conceptually showing the structure of a semiconductor wafer according to this embodiment. As shown in FIG. 1A, a wafer 100 comprises a multiplicity of chip regions 110.

Figure 1B:
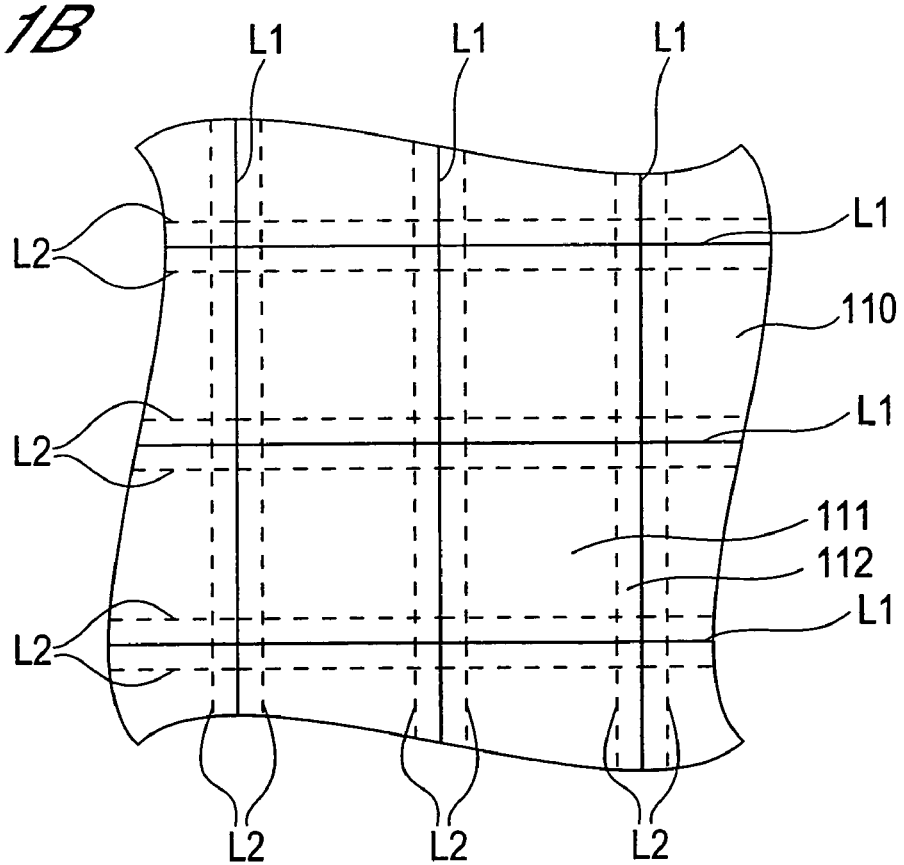
FIG. 1B is a partial enlarged view of FIG. 1A.

FIG. 1B is a partial enlarged view of FIG. 1A. In FIG. 1B, the solid lines L1 conceptually show the chip region boundaries. That is, the regions delimited by the lines L1 are the chip regions 110. Each of the chip regions 110 comprises a circuit region 111 and a wiring region 112. In FIG. 1B, the dotted lines L2 conceptually show the boundary between the circuit region 111 and the wiring region 112.

As will be described below, in the fabrication process for a semiconductor device that has a WCSP structure, the semiconductor wafer 100 is diced along the lines L1. On the other hand, in a fabrication process of a semiconductor device for which a package structure other than a WCSP structure is adopted, the semiconductor wafer 100 can be diced along the lines L2.

Figure 2:
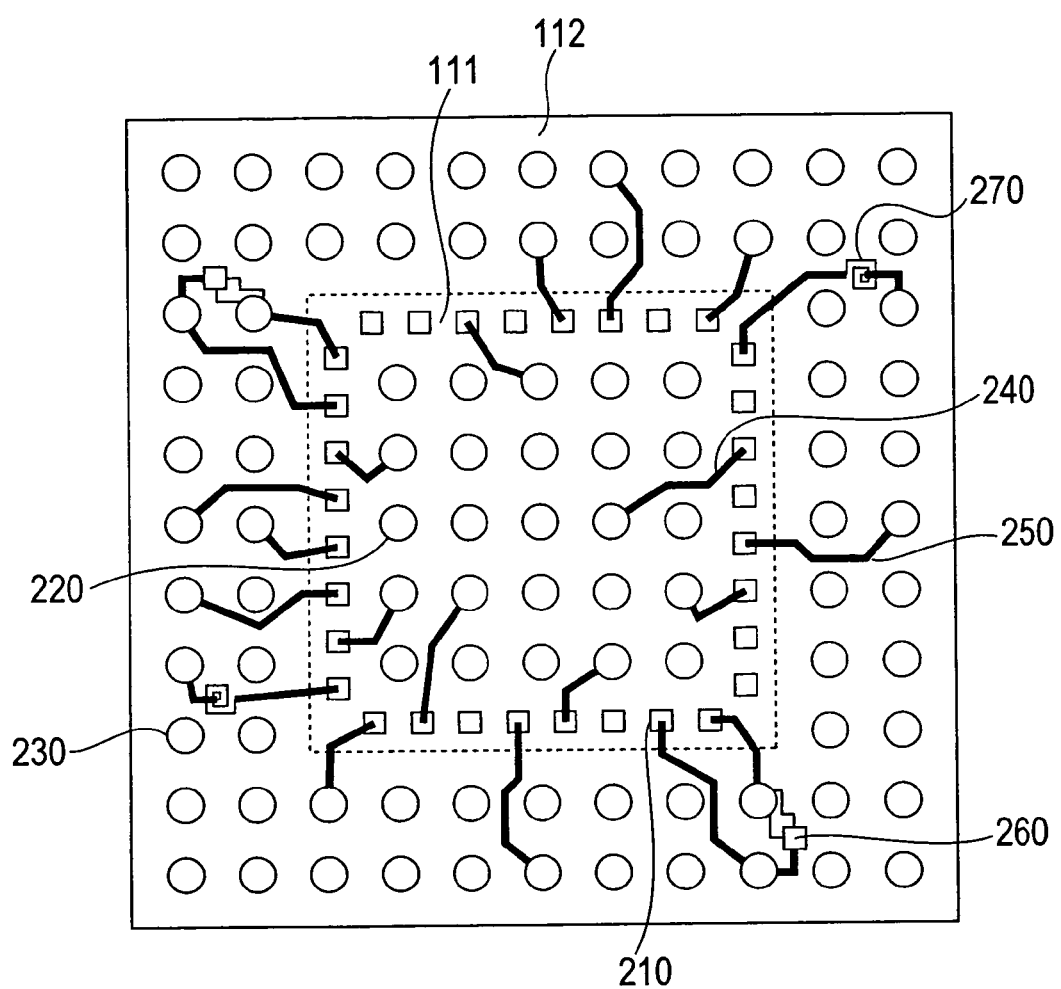
FIG. 2 is a conceptual view showing the mount face of the semiconductor chip according to a first embodiment.

FIG. 2 is a conceptual view showing the mount face of a semiconductor chip.

As described above, the mount face of a semiconductor device 200 comprises the circuit region 111 and the wiring region 112. As will be described subsequently using FIG. 4, the integrated circuit (not shown in FIG. 2) is formed below the circuit region 111. On the other hand, redistribution wiring for connecting the integrated circuit to external terminals and elements for regulating the capacitance and inductance of the redistribution wiring are formed in the wiring region 112.

A plurality of electrode pads 210 is provided in the circuit region 111. These electrode pads 210 are arranged at regular intervals along the outer edge of the circuit region 111. In addition, a plurality of first external terminals 220 is arranged at regular intervals within the arrangement of electrode pads 210. Meanwhile, a plurality of second external terminals 230 is arranged at regular intervals in the wiring region 112. The first and second external terminals 220 and 230 are connected to the circuit substrate (not shown) by using the above-described fan-in method. As shown in FIG. 2, some or all of the first external terminals 220 is/are connected to any of the electrode pads 210 by means of a first wiring pattern 240. Also, some or all of the second external terminals 230 is/are connected to any of the electrode pads 210 by means of a second wiring pattern 250. In other words, the second external terminals 230 and the electrode pads 210 are connected by using the fan-out method. The relationship governing the connection between the electrode pads 210 and the external terminals 220 and 230 is optionally determined by the designer in accordance with conditions for the structure of the integrated circuit or other conditions.

The second wiring pattern 250 is provided with an inductor 260 and a capacitor 270. The inductor 260 and capacitor 270 are formed according to requirements in order to prevent electromagnetic interference of the integrated circuit in the circuit region 111 and the external terminals 220 and 230. In the example in FIG. 2, these passive elements 260 and 270 are connected in series in the connection path of the second wiring pattern 250. The size and material of the inductor 260 and capacitor 270 can be optionally determined by the designer.

The redistribution wiring structure according to this embodiment is described below.

Figure 3:
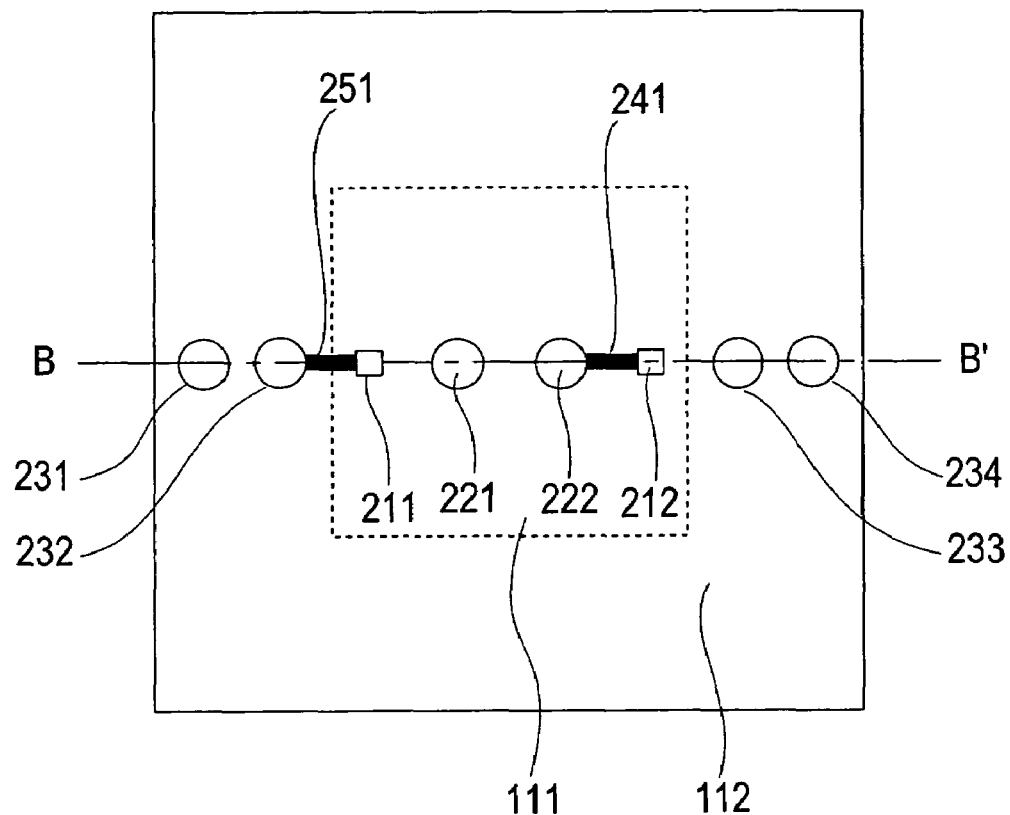
FIG. 3 is a planar view conceptually showing the redistribution wiring structure of the first embodiment.
Figure 4:
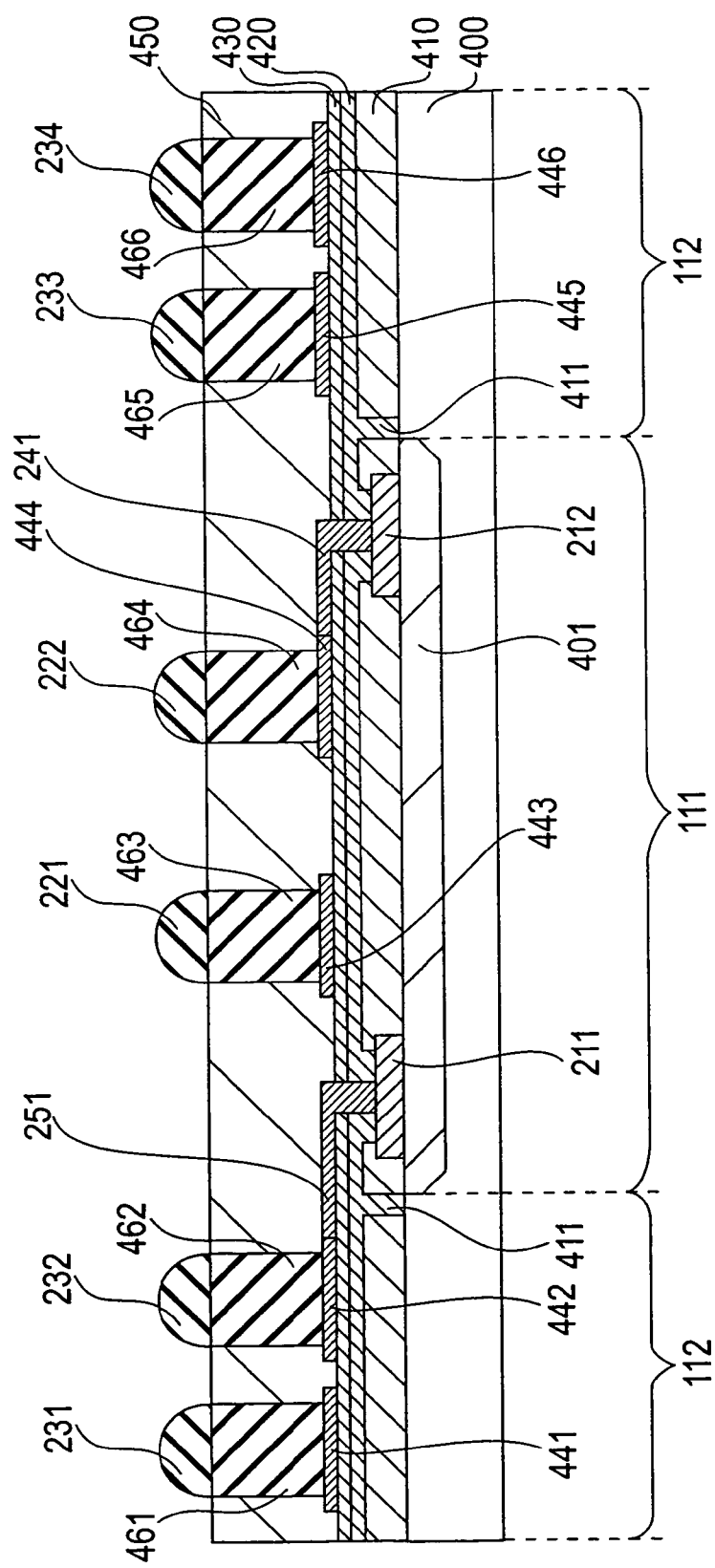
FIG. 4 is a cross-sectional view along the line B-B' of FIG. 3.

FIGS. 3 and 4 illustrate examples of a redistribution wiring structure that does not comprise an inductor or capacitor. FIG. 3 is a planar view conceptually showing the redistribution wiring structure of this embodiment and FIG. 4 is a cross-sectional view along the line B-B' in FIG. 3.

As shown in FIGS. 3 and 4, the circuit region 111 is provided with electrode pads 211 and 212 and first external terminals 221 and 222, and the wiring region 112 is provided with second external terminals 231, 232, 233, and 234. These elements 211, 212, 221, 222, and 231 to 234 are arranged in the form of a line. In addition, the electrode pad 212 and the external terminal 222 are connected by a first wiring pattern 241, and the electrode pad 211 and the second external terminal 232 are connected by a second wiring pattern 251.

As shown in FIG. 4, an integrated circuit 401 is formed in the surface of the substrate 400. Further, the surface of the substrate 400, and the electrode pads 211 and 212 are covered by a passivation film 410. The passivation film 410 has grooves 411 which are formed close to the boundary between the circuit region 111 and the wiring region 112. The grooves 411 are equivalent to the lines L2 in FIG. 1. The surface of the passivation film 410 is covered by twin-layer insulation films 420 and 430. The insulation films 420 and 430 are provided in order to ensure insulation between the wiring patterns 241 and 251. In the example of FIGS. 3 and 4, because the wiring region 112 is provided with an inductor 260 and a capacitor 270 (See FIG. 2), the insulation film may be formed in a single layer. The surface of the insulation film 430 is provided with electrically conductive post pads 441 to 446 and wiring patterns 241 and 251. The post pads 441 to 446 are arranged in the positions where the external terminals 221, 222, and 231 to 234 are formed. The passivation film 410 and insulation films 420 and 430 comprise openings which are provided on the electrode pads 211 and 212. The electrode pads 211 and 212 and the wiring patterns 241 and 251 are connected via these openings. Posts 461 to 466 are provided on the post pads 441 to 446. In addition, a sealing film 450 is formed on the surface of the insulation film 430. The ends of the posts 461 to 466 are exposed via the sealing film 450. Further, the external terminals 221, 222, and 231 to 234 are provided on these exposed faces. The external terminals 221, 222, and 231 to 234 are formed by solder, for example.

Figure 5A:
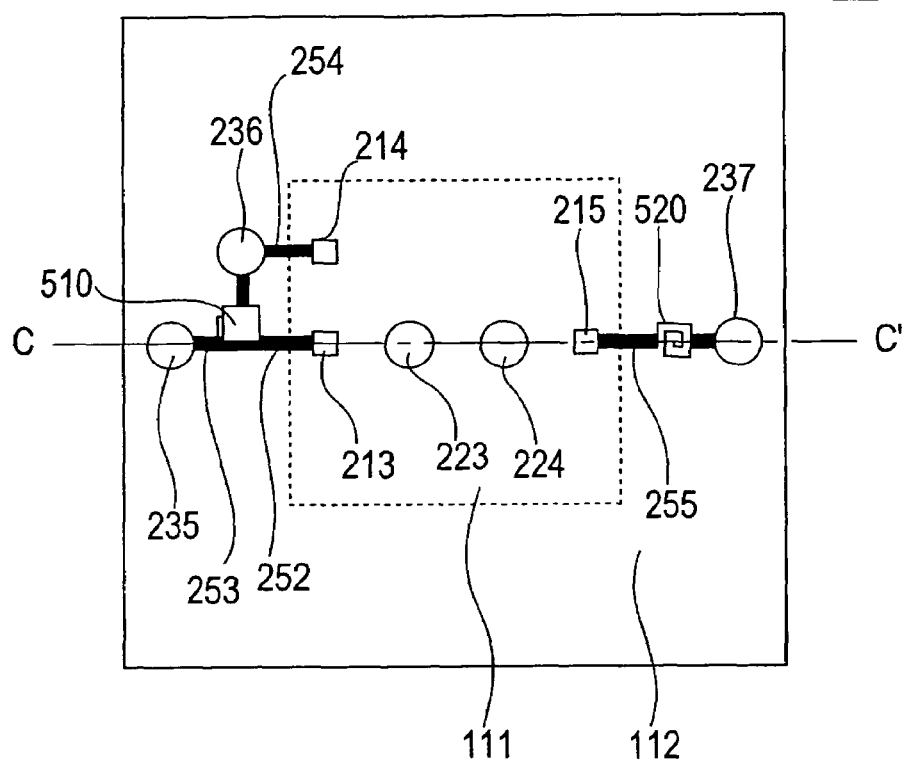
FIG. 5A is a planar view conceptually showing the redistribution wiring structure of the first embodiment.
Figure 5B:
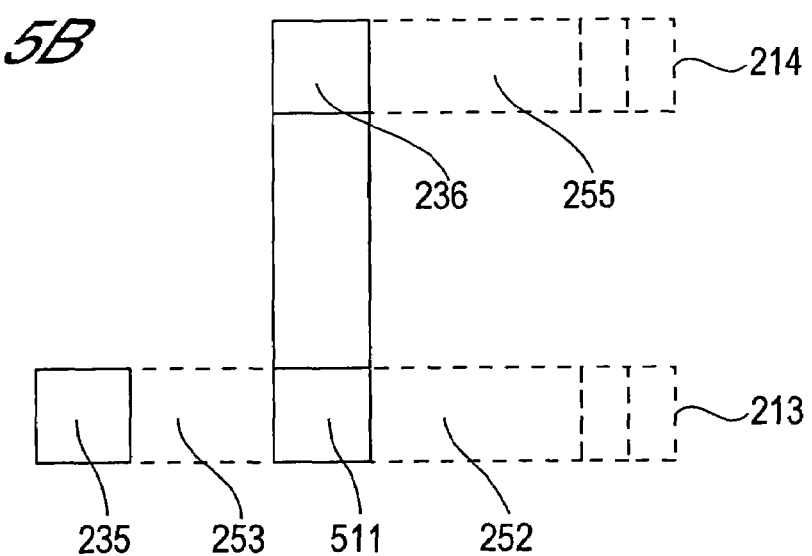
FIG. 5B is a conceptual view that shows an enlargement of part of the redistribution wiring structure shown in FIG. 5A.
Figure 6:
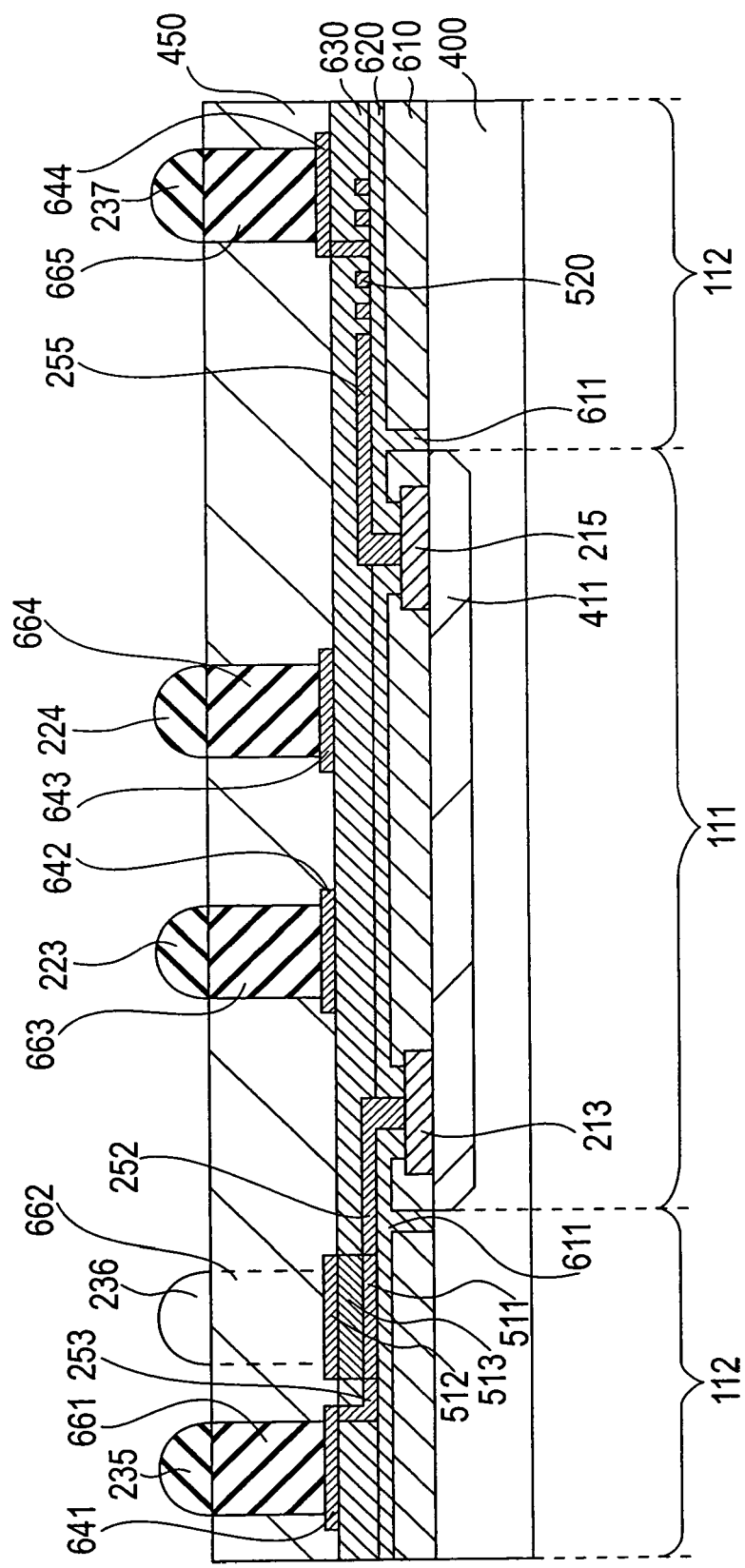
FIG. 6 is a cross-sectional view along the line C-C' in FIG. 5A.

FIGS. 5A, 5B and FIG. 6 show an example of a redistribution wiring structure that comprises an inductor and a capacitor. FIG. 5A is a planar view conceptually showing the redistribution wiring structure of this embodiment; FIG. 5B is a conceptual view that shows an enlargement of part of the redistribution wiring structure shown in FIG. 5A; and FIG. 6 is a cross-sectional view along the line C-C' in FIG. 5A.

As shown in FIGS. 5A, 5B and 6, electrode pads 213, 214, and 215, and first external terminals 223 and 224 are provided in the circuit region 111, and second external terminals 235, 236, 237, a capacitor 510 and an inductor 520 are provided in the wiring region 112. One end of the capacitor 510 is connected to the electrode pad 213 by a second wiring pattern 252 and is connected to the second external terminal 235 by a wiring pattern 253. The other end of the capacitor 510 is integrally formed with a second external terminal 236 (described subsequently). The electrode pad 214 and the second external terminal 236 are connected by a wiring pattern 254. In addition, the electrode pad 215 and one end of the inductor 520 are connected by a wiring pattern 255, and the other end of the inductor 520 and the second external terminal 237 are integrally formed (described subsequently).

As shown in FIG. 6, the electrode pads 213 to 215 and the surface of the substrate 400 are covered by a passivation film 610. The passivation film 610 comprises grooves 611 which are formed close to the boundary between the circuit region 111 and the wiring region 112. The grooves 611 are equivalent to the lines L2 in FIG. 1. The surface of the passivation film 610 is covered by an insulation film 620. The insulation film 620 is provided in order to ensure insulation between wiring patterns 252 to 257. The surface of the insulation film 620 is provided with a lower electrode 511 for the capacitor 510, the inductor 520, and the wiring patterns 252 to 255. However, the wiring pattern 254 is not shown in FIG. 4. The passivation film 610 and the insulation film 620 have openings which are provided on the electrode pads 213 to 215. The electrode pads 213 to 215 and the wiring patterns 252 to 253 are connected via these openings. An insulation film 630 is also formed on the surface of the insulation film 620.

An upper electrode 512 of the capacitor 510 is formed on the insulation film 630. Within the insulation film 630, a dielectric film 513 of the capacitor 510 is embedded in a region which is sandwiched between the lower electrode 511 and the upper electrode 512. As shown in FIG. 6, post pads 641 to 644 are formed on the insulation film 630. The post pads 641 to 644 are arranged in the positions where the external terminals 223, 224, 235 and 237 are formed. In FIG. 6, the post pad which corresponds with the external terminal 236 is not shown. As shown in FIG. 6, the post pad 641 is connected to the wiring pattern 253 via a through-hole in the insulation film 630. Likewise, the post pad 644 is directly connected to the inductor 520 via a through-hole in the insulation film 630. Here, the inductor 520 is constituted by a coil-shaped wiring pattern. As shown in FIG. 5B, the post pad which corresponds with the external terminal 236 is integrally formed with the upper electrode 512 of the capacitor 510.

Posts 661 to 665 are provided on the post pads 641 to 645. In addition, a sealing film 650 is formed on the surface of the insulation film 630. The upper surfaces of the posts 661 to 665 are exposed via the sealing film 650. Further, the external terminals 223, 224, and 235 to 237 are provided on these exposed surfaces. The external terminals 223, 224, and 235 to 237 are formed by solder, for example.

In this embodiment, the total number of external terminals is the sum of the quantity of the first external terminals and the quantity of the second external terminals. Expressed differently, the present embodiment increases the total number of external terminals by providing the semiconductor chip 200 with the wiring region 112.

Therefore, according to the present embodiment, the structure and integration rate of the integrated circuit formed in the circuit region 111 can be made the same irrespective of the desired number of external terminals. In cases where the number of external terminals is changed, it is acceptable to only change the area of the wiring region 112.

Figure 20A:
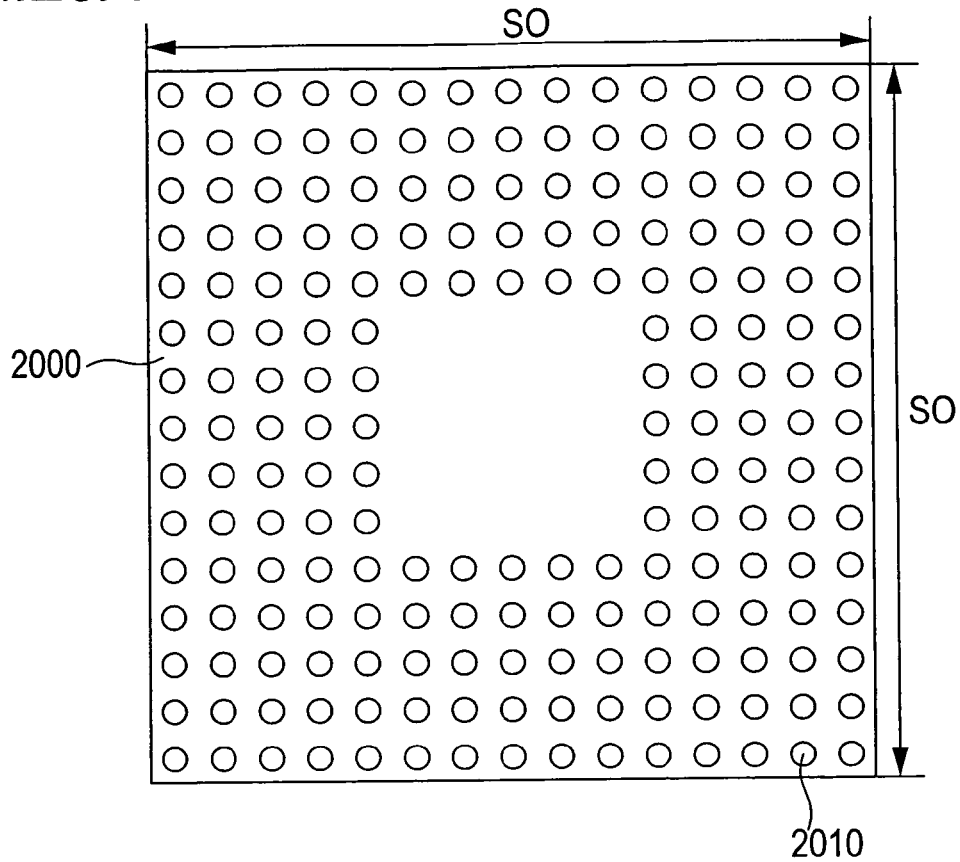
FIG. 20A is a conceptual view of the mount face.
Figure 20B:
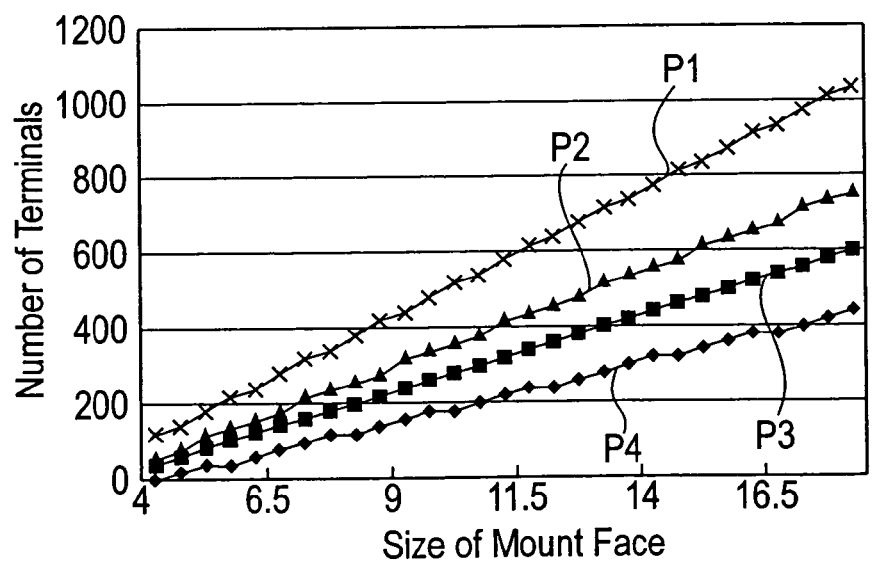
FIG. 20B is a graph which serves to illustrate the relationship between the size of the mount face of the semiconductor device according to the first embodiment and the maximum number of external terminals.

An example of the relationship between the size of the mount face and the total number of external terminals will now be illustrated using FIGS. 20A and 20B.

FIG. 20A is a conceptual view of the mount face. In the example shown in FIG. 20A, external terminals 2010 are arranged in five rows along the outer edge of a mount face 2000. The mount face is the square S0×S0.

FIG. 20B is a graph that shows the relationship between the size of the mount face and the total number of external terminals. In FIG. 20B, the size S0 is plotted on the horizontal axis and the total number of external terminals is plotted on the vertical axis. In addition, in FIG. 20B, P1 is a case where the pitch of the external terminals is 0.30 mm, P2 is a case where the pitch of the external terminals is 0.40 mm, P3 is a case where the pitch of the external terminals is 0.50 mm, and P4 is a case where the pitch of the external terminals is 0.65 mm.

For example, in a case where the size S0 of the mount face is 7 mm and the pitch of the external terminals is 0.5 mm, the total number of external terminals is at most 160. As can be seen from FIG. 20B, in a case where the size S0 of the mount face is 7 mm, in order to make the total number of external terminals on the order of 300, the pitch of the external terminals must be on the order of 0.30 mm. Correspondingly, the semiconductor chip of this embodiment permits the size of the mount face to be easily enlarged. Therefore, the total number of external terminals can be increased without narrowing the pitch of the external terminals.

In addition to WCSPs, known package structures include structures that employ wire bonding (WB) and structures that employ flip chip bonding (FCB). These packaging techniques involve mounting the semiconductor chip on the surface of an interposer substrate. External terminals are provided on the reverse side of the interposer substrate. Therefore, with a package that employs WB or FCB or the like, the reverse side of the interposer substrate is the mount face. Therefore, in a case where there is a desire to increase the number of external terminals without narrowing the pitch, the area of the interposer substrate may be enlarged.

However, with a package that employs WB, when the area of the interposer substrate is enlarged, the inductance rises between the electrode pads of the semiconductor chip and the external terminals of the interposer substrate. A package that employs FCB necessitates the use of a high-cost build-up substrate as the interposer substrate. In addition, the producibility of FCB is poor on account of the long time required for bonding. Therefore, the fabrication costs of packages that employ FCB are high. Also, when WB or FCB is used, the thickness of the package is extremely large. The thicknesses of typical packages are such that, whereas the thickness of a WCSP structure is on the order of 0.45 to 0.7 mm, the thickness of a WB structure is on the order of 1.05 to 1.4 mm, and the thickness of a FCB structure is on the order of 0.8 to 1.00 mm.

The semiconductor device of this embodiment allows the maximum number of external terminals to be regulated by only regulating the area of the wiring region 112. For this reason, the number of external terminals can be increased without harming the above-described virtues of the WCSP structure.

As described above, according to the present embodiment, grooves 411 or 611 are formed between the circuit region 111 and the wiring region 112 (See FIGS. 4 and 6). When the semiconductor chip 110 is cut from the semiconductor wafer 100, cutting can also be performed along these grooves. That is, dicing can be performed along the lines L2 in FIG. 1. In this case, the wiring region 112 is removed such that the semiconductor chip is constituted by the circuit region 111 alone. The semiconductor chip which has been cut from the wafer in this way can then be employed as is in packaging other than a WCSP.

As described above, according to this embodiment, passive elements (the inductor 260 and capacitor 270) which serve to prevent electromagnetic interference are formed in the wiring region 112. As a result, the number of parts of the substrate on which the semiconductor device is mounted can be reduced and therefore down-sizing of the mount substrate can be implemented. In addition, by providing the wiring region 112 with the capacitor 270, the wiring pattern connecting the electrode pads and the external terminals is shortened. For this reason, the parasitic inductance that is caused by the wiring pattern is smaller than for a case where the same capacitor is provided on the mount substrate (that is, a case where the capacitor 270 is not provided in the wiring region 112), and, as a result, the noise generated by the capacitor is reduced.

Next, the semiconductor device fabrication method according to this embodiment will now be described using FIGS. 7A to 9. FIGS. 7A to 9 are outline cross-sectional views that serve to illustrate the fabrication process for the above-described semiconductor device shown in FIGS. 3 and 4.

First of all, as shown in FIG. 7A, an integrated circuit 401 is formed in the surface of the semiconductor wafer 100 by an ordinary semiconductor fabrication process. In addition, the electrode pads 211 and 212 are formed along the outer edge of the integrated circuit 401. An ordinary thin-film deposition technique and photolithographic technique, for example, are employed in the formation of the electrode pads 211 and 212. An aluminum alloy, gold alloy, or copper alloy or similar, for example, can be employed for the electrode pads 211 and 212.

Next, a passivation film 410 formed from SiN, for example, is formed over the whole surface of the semiconductor wafer 100. An ordinary thin-film deposition technique can be employed in the formation of the passivation film 410. The film thickness of the passivation film 410 is 0.5 to 1.0 µm, for example. Grooves 411 and openings 412 are formed in the passivation film 410 by employing an ordinary photolithographic technique. The grooves 411 are formed at the boundary between the circuit region 111 and the wiring region 112. The openings 412 are formed above the electrode pads 211 and 212. With the exception of the outer edge parts, the surfaces of the electrode pads 211 and 212 are exposed by openings 412.

As shown in FIG. 7B, a first insulation film 420 is formed over the whole surface of the semiconductor wafer 100. Spin-coating, for example, is employed as the technique for forming the insulation film 420. The thickness of the insulation film 420 is on the order of 10 µm, for example. Openings 421 are formed in the insulation film 420 by using an ordinary photolithographic technique, for example. The central part of the surface of the electrode pads 210 is thus exposed by the openings 421.

As shown in FIG. 8A, a second insulation film 430 is formed over the whole surface of the semiconductor wafer 100. The formation method and thickness of the second insulation film are the same as for the first insulation film. Openings 431 are provided in the second insulation film 430 by using an ordinary photolithographic technique, for example. The central part of the surface of the electrode pads 211 and 212 is thus exposed by the openings 431.

As shown in FIG. 8B, the post pads 441 to 446, and the wiring patterns 241 and 251 are provided by means of an electrically conductive material such as copper or a copper alloy. In this process, an electrically conductive material film is initially formed by using sputtering in which a Ti—Cu alloy, for example, is the target. A resist pattern is then formed on the electrically conductive material film by using an ordinary photolithographic technique. Next, with the resist pattern serving as a mask, a plating film pattern is formed on the electrically conductive material layer and then the resist pattern is removed. Then, with the plating film pattern serving as the mask, the electrically conductive material film is etched, whereby the post pads 441 to 446 and the wiring patterns 241 and 251 are formed. The thickness of the electrically conductive patterns 241, 251, and 441 to 446 is on the order of 5 µm, for example.

In addition, posts 461 to 466 are formed on the electrically conductive patterns 241, 251 and 441 to 446 (See FIG. 8B). For example, in this process, a copper plating layer is first formed over the whole surface of the semiconductor wafer 100 and then, by using an ordinary photolithographic technique to pattern the copper plating layer, the posts 461 to 466 are formed. In the photolithographic process, dry development is desirably used. The diameter of the posts is on the order of 100 to 250 µm, for example.

Figure 9:
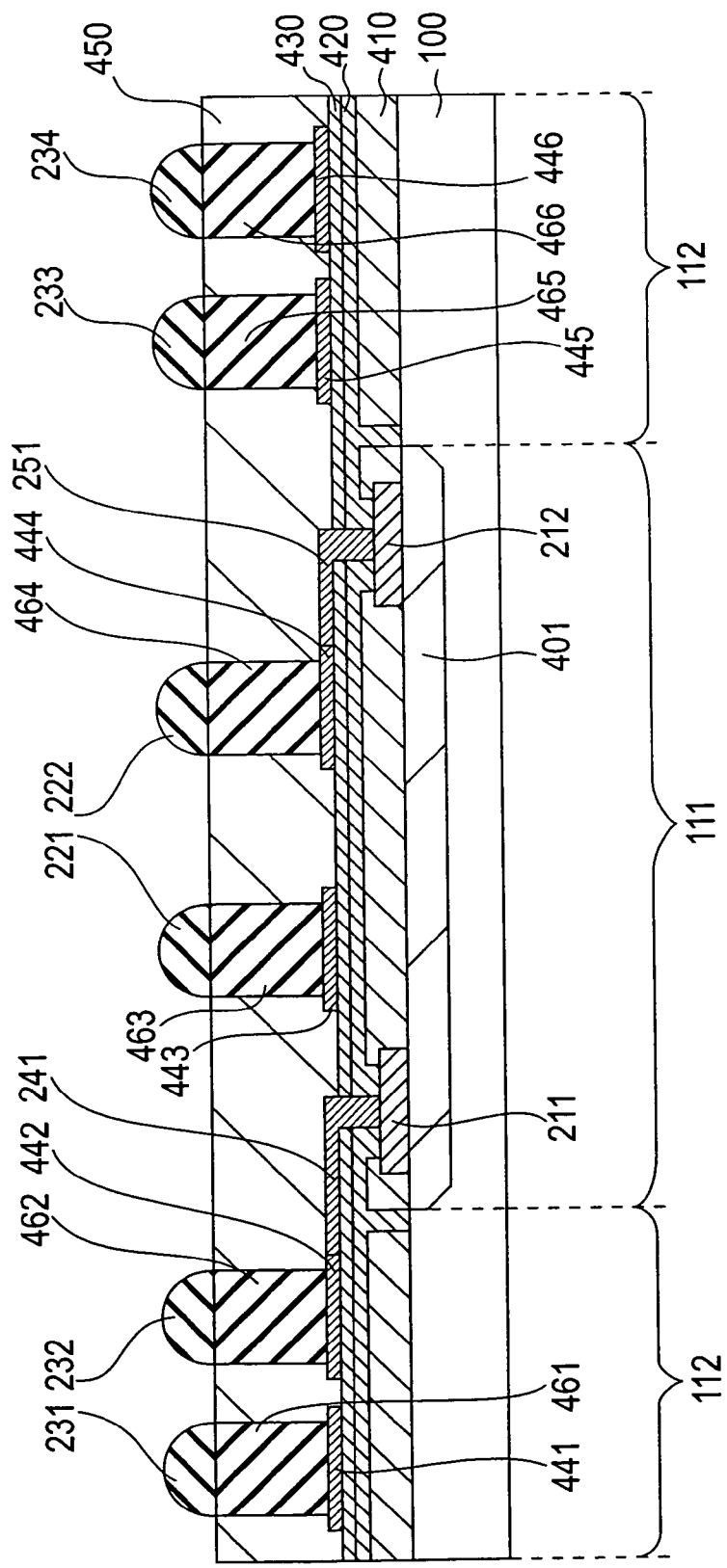

As shown in FIG. 9, the sealing film 450 is formed by using an ordinary transfer mold method or print method, for example. An epoxy mold resin or a sealing resin such as a liquid sealing material, for example, is employed as the sealing film 450.

In addition, as shown in FIG. 9, the external terminals 221, 222, and 231 to 234 are formed. Solder, for example, is employed as the material for forming the external terminals 221, 222, and 231 to 234. The external terminals 221, 222, and 231 to 234 are formed by ordinary solder paste printing or solder ball mounting.

Thereafter, a multiplicity of semiconductor chips 200 is formed by dicing the semiconductor wafer 100.

Next, another fabrication method for the semiconductor device according to the present embodiment will be described. FIGS. 10A to 12 are outline cross-sectional views that serve to illustrate the fabrication process for the above-described semiconductor device shown in FIGS. 5A, 5B and 6.

First of all, as per the earlier example (See FIGS. 7A and 7B), the integrated circuit 401, the electrode pads 211 and 212, the passivation film 610, the grooves 611, the openings 612, the first insulation film 620 and the openings 621 are formed.

Next, as shown in FIG. 10A, the wiring patterns 252 to 255, the lower electrode layer 511 and the inductor 520 are formed by an electrically conductive material such as copper or a copper alloy. FIG. 10A does not show the wiring pattern 254. In this process, an electrically conductive material film is initially formed by employing sputtering in which a Ti—Cu alloy, for example, is the target. A resist pattern is then formed on the electrically conductive material film by using an ordinary photolithographic technique. Next, with the resist pattern serving as a mask, a plating film pattern is formed on the electrically conductive material layer and then the resist pattern is removed. Then, with the plating film pattern serving as the mask, the electrically conductive material film is etched, whereby the wiring patterns 252 to 255, the lower electrode 511 and the inductor 520 are formed. The thickness of the electrically conductive patterns 252 to 255, 511, and 520 is on the order of 5 µm, for example. The inductance of the inductor 520 can be regulated by the film thickness.

Next, as shown in FIG. 10B, the dielectric film 513 of barium titanium oxide or similar is formed on the surface of the lower electrode 511. The thickness of the dielectric film 513 is on the order of 5 µm, for example. In this process, a dielectric film is formed over the whole surface of the semiconductor wafer 100 by using spin-coating or similar, and then the dielectric film is patterned by using an ordinary photolithographic technique.

Figures 11A, 11B:
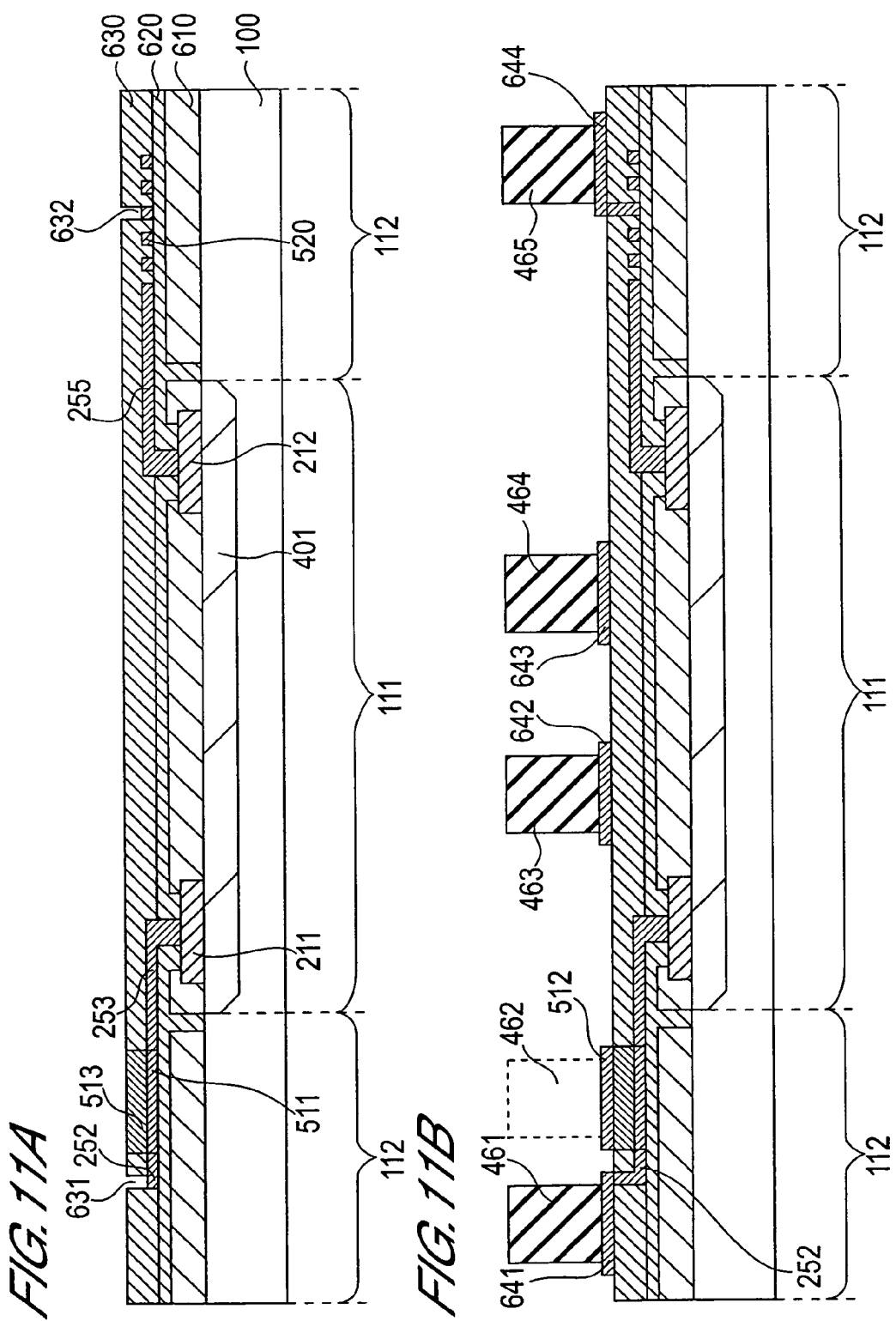

Next, as shown in FIG. 11A, a second insulation film 630 is formed on the surface of the first insulation film 620. Spin-coating, for example, is employed as the technique for forming the second insulation film 630. The thickness of the second insulation film 630 is on the order of 10 µm, for example. Then, openings 631 and 632 are provided in the second insulation film 630. As shown in FIG. 11A, the opening 631 exposes part of the wiring pattern 252 and the opening 632 exposes the central part of the inductor 520.

According to the fabrication process of this embodiment, although the second insulation film 630 is formed after forming the dielectric film 513, the dielectric film 513 can also be formed after forming the second insulation film 630. When the second insulation film 630 is formed first, an opening for forming the dielectric film 513 is provided in the second insulation film 630, and the dielectric material is embedded in this opening.

Next, as shown in FIG. 11B, the post pads 641 to 644 and the upper electrode 512 are formed by means of an electrically conductive material such as copper or a copper alloy. In this process, an electrically conductive material film is initially formed by employing sputtering in which a Ti—Cu alloy, for example, is the target. A resist pattern is then formed on the electrically conductive material film by using an ordinary photolithographic technique. Next, with the resist pattern serving as a mask, a plating film pattern is formed on the electrically conductive material layer and then the resist pattern is removed. Then, with the plating film pattern serving as the mask, the electrically conductive material film is etched, whereby the post pads 641 to 644 and the upper electrode 512 are formed. The thickness of the electrically conductive patterns 512 and 641 to 644 is on the order of 5 μm, for example.

In addition, as shown in FIG. 11B, the posts 461 to 466 are formed. For example, in this process, a copper plating layer is first formed over the whole surface of the semiconductor wafer 100 and then the posts 461 to 466 are formed by patterning the copper plating film by using an ordinary photolithographic technique. In the photolithographic process, dry development is desirably used. The diameter of the posts is on the order of 100 to 250 μm, for example.

Figure 12:
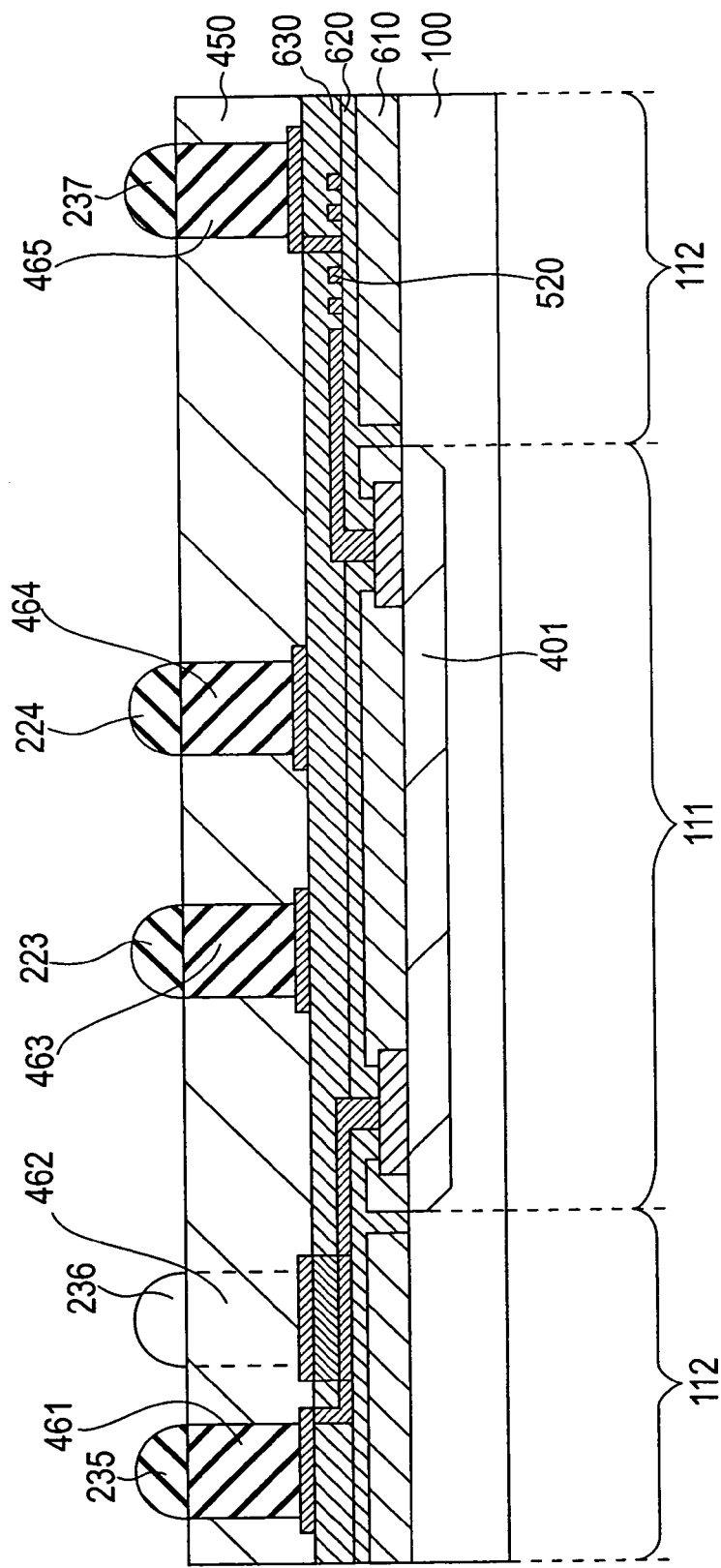

As shown in FIG. 12, the sealing film 450 is formed by using an ordinary transfer mold method or print method, for example. An epoxy mold resin or a sealing resin such as a liquid sealing material, for example, is employed as the sealing film 450.

In addition, as shown in FIG. 12, the external terminals 223, 224, and 235 to 237 are formed. Solder, for example, is employed as the material for forming the external terminals 223, 224, and 235 to 237. The external terminals 221, 222, and 231 to 234 are formed by ordinary solder paste printing or solder ball mounting.

Thereafter, a multiplicity of semiconductor chips 200 is formed by dicing the semiconductor wafer 100.

According to the fabrication method of this embodiment which was described above, the semiconductor chip 200 can be fabricated inexpensively by means of a simple process and therefore fabrication costs are low.

The present embodiment was described taking, as an example, a case where the present invention is applied to a semiconductor device that adopts a WCSP structure. Correspondingly, in a semiconductor device that adopts a package structure other than a WCSP structure (a structure in which wire bonding is performed on the electrode pads of the circuit region, for example), external terminals are not required and hence the wiring region 112 is not necessary. In this case, dicing may be performed along the grooves 411 after forming the electrode pads 211 and 212 in the circuit region 111 (See FIG. 7A). Thus, according to this embodiment, the fabrication process up until FIG. 7A can be shared by a semiconductor device for which a WCSP structure is adopted and by a semiconductor device that adopts another structure. Therefore, the fabrication costs of the semiconductor device can be reduced.

Second Embodiment

The second embodiment of the present invention will be described next.

According to the first embodiment described above, a capacitor and an inductor are formed in the redistribution wiring layer (the layer sandwiched between the insulation layers 620 and 630 in FIG. 6). In contrast, the capacitor and inductor are formed below the redistribution wiring layer in the present embodiment.

Figure 13:
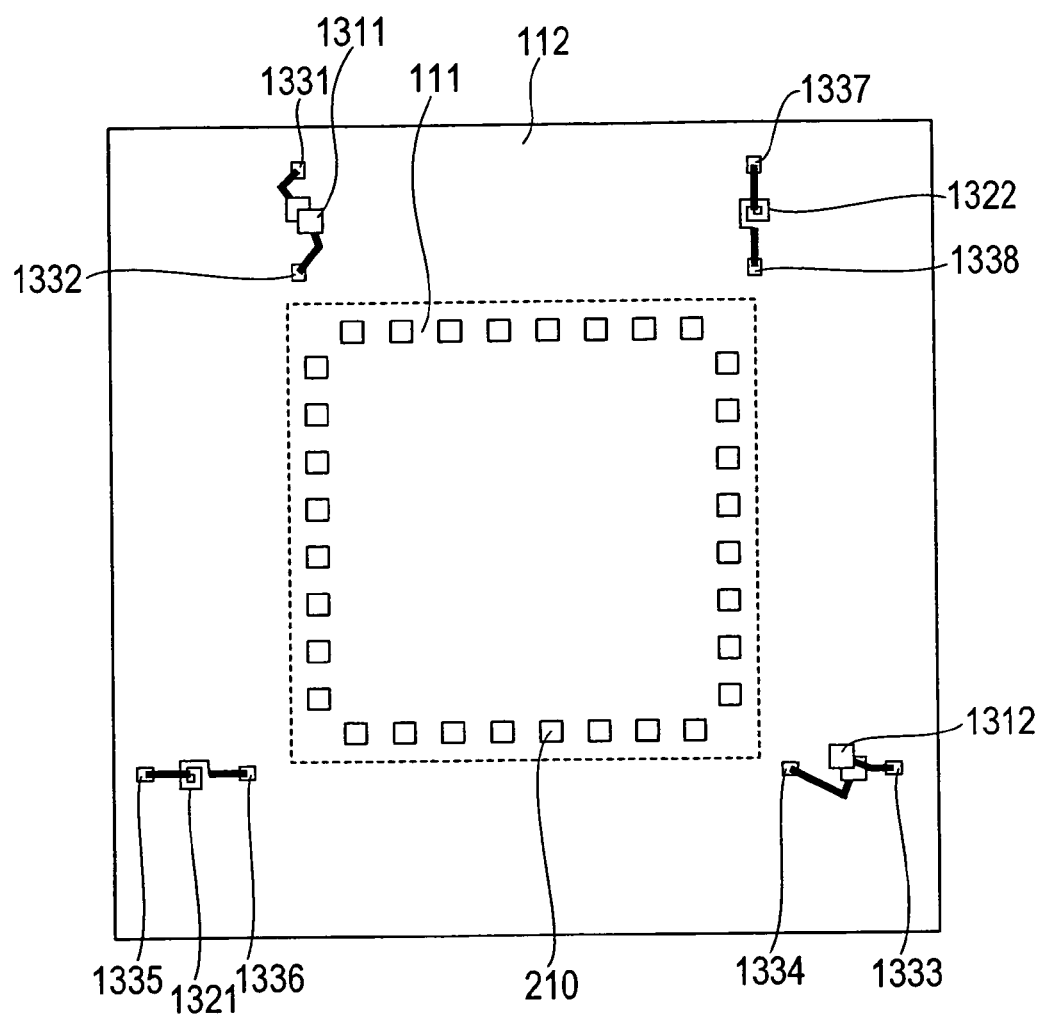
FIG. 13 is a planar view showing the structure below the redistribution wiring layer, according to the second embodiment.

The overall constitution of the semiconductor wafer according to this embodiment is the same as that of the semiconductor wafer of the first embodiment (FIGS. 1A and 1B) FIG. 13 is a planar view showing the structure below the redistribution wiring layer, of the present embodiment.

As shown in FIG. 13, the semiconductor chip 1300 of this embodiment comprises the circuit region 111 and the wiring region 112.

A plurality of electrode pads 210 is provided in the circuit region 111 as per the first embodiment (See FIG. 2).

Two capacitors 1311, 1312 and two inductors 1321, 1322 are formed in the wiring region 112. The capacitor 1311 is connected to the electrode pads 1331 and 1332, and the capacitor 1312 is connected to the electrode pads 1333 and 1334. The inductor 1321 is connected to the electrode pads 1335 and 1336 and the inductor 1322 is connected to the electrode pads 1337 and 1338.

Figure 14:
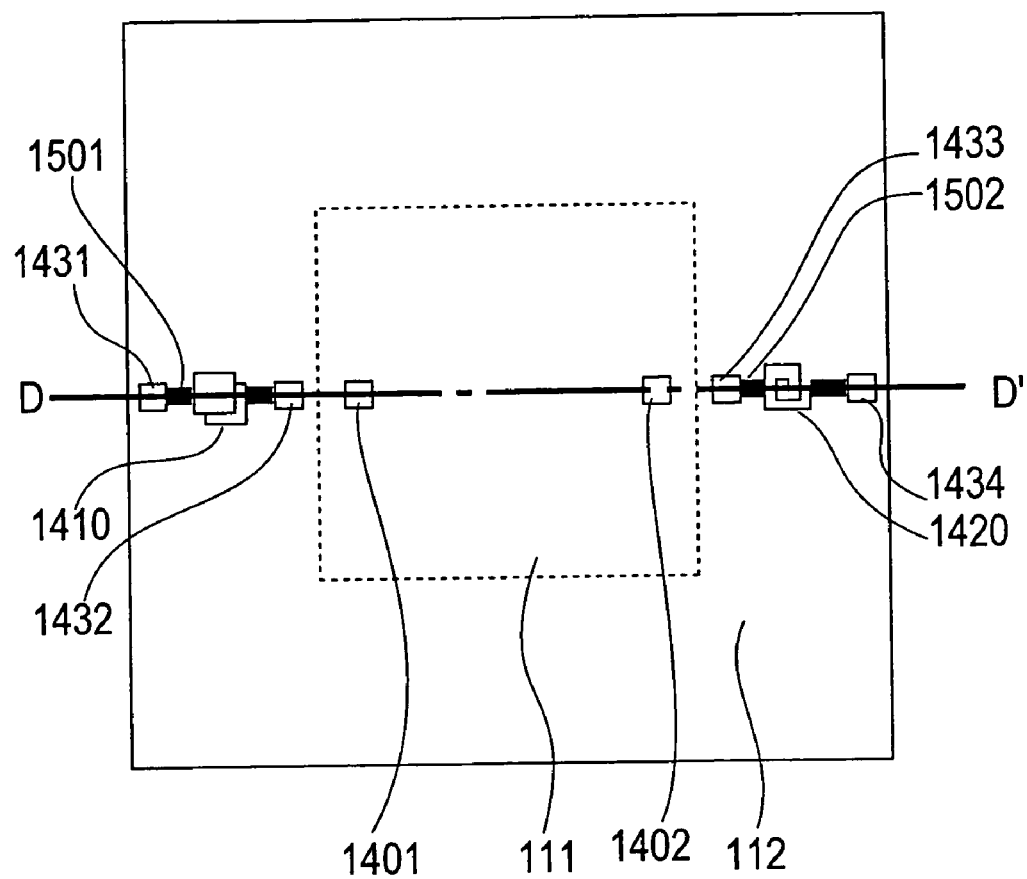
FIG. 14 is a planar view showing the redistribution wiring structure according to the second embodiment.
Figure 15:
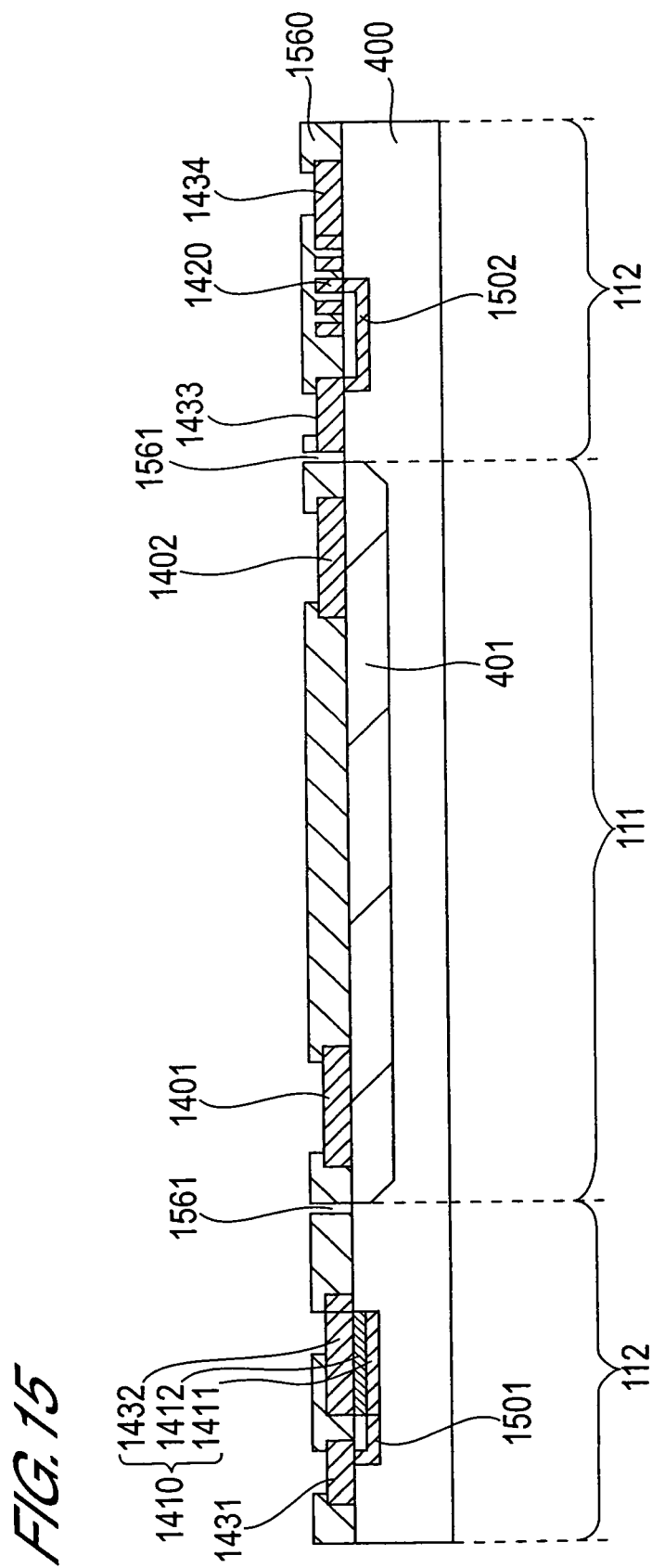
FIG. 15 is a cross-sectional view along the line D-D' in FIG. 14A.

The constitution of the capacitors and inductors will be described in more detail below by using FIGS. 14 and 15. FIG. 14 is a planar view and FIG. 15 is a cross-sectional view along the line D-D' in FIG. 14A.

Electrode pads 1401 and 1402 are provided in the circuit region 111. A capacitor 1410, an inductor 1420, and electrode pads 1431 to 1434 are provided in the wiring region 112.

The capacitor 1410 is constituted by a lower electrode 1411, a dielectric film 1412, and an upper electrode 1432. That is, the electrode pad 1432 is also employed as an upper electrode. The lower electrode 1411 is connected to the electrode pad 1431 by a wiring pattern 1501.

The inductor 1420 has a coil shape. The inner terminal of the inductor 1420 is connected to an electrode pad 1433 by a wiring pattern 1502. The outer terminal of the inductor 1420 is formed integrally with an electrode pad 1434.

As shown in FIG. 15, the electrode pads 1401, 1402, and 1431 to 1434 and the surface of the substrate 400 are covered by a passivation film 1560. The passivation film 1560 has grooves 1561 which are formed close to the boundary between the circuit region 111 and the wiring region 112. The grooves 1561 are equivalent to the lines L2 in FIG. 1. The passivation film 1560 has openings that serve to expose the central part of the electrode pads 1401, 1402, and 1431 to 1434.

Figure 16:
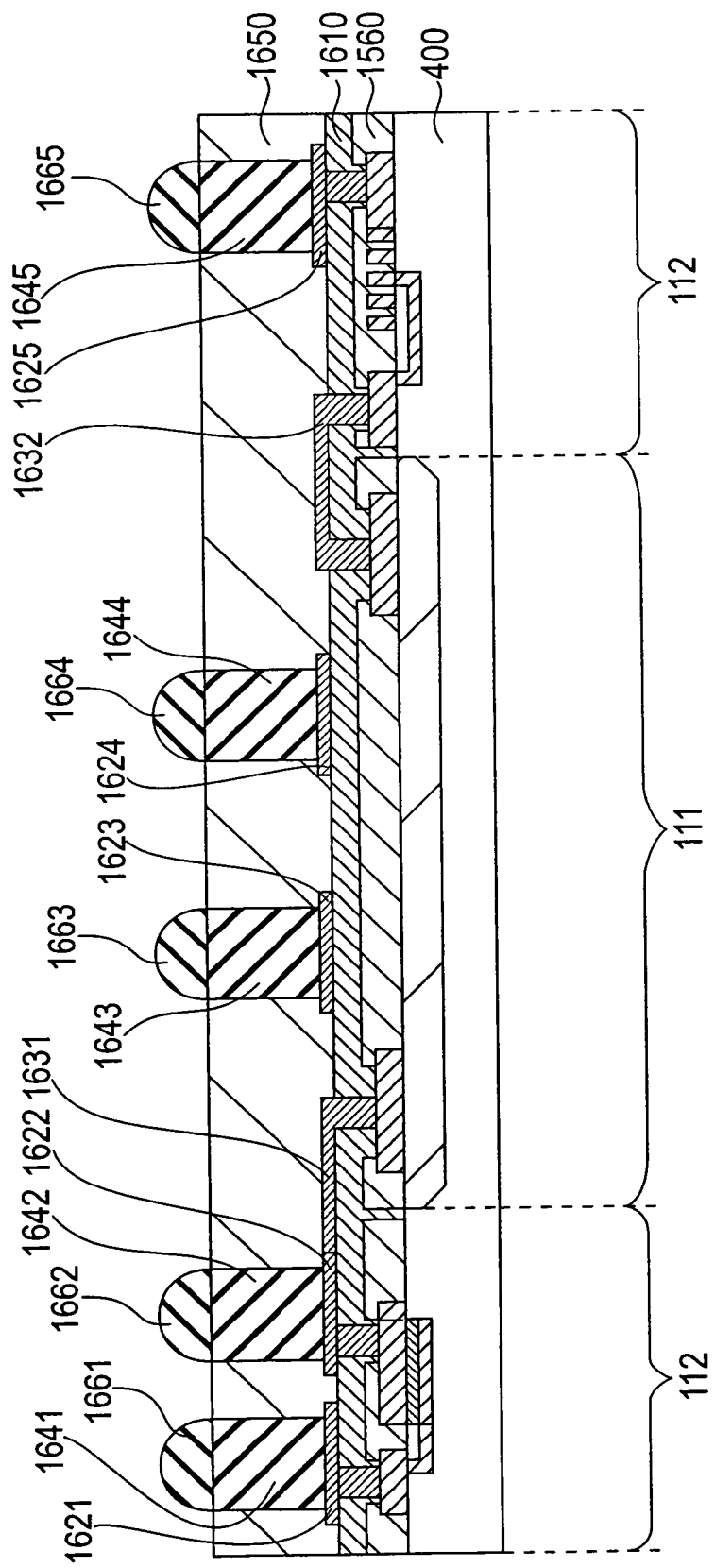
FIG. 16 is a conceptual view showing the cross-sectional structure of the semiconductor device according to the second embodiment.

As shown in FIG. 16, a redistribution wiring structure, posts and external terminals are formed on the surface of the semiconductor wafer shown in FIGS. 14 and 15. FIG. 16 is equivalent to a cross-section along the line D-D' in FIG. 14.

As shown in FIG. 16, an insulation film 1610 is formed on the passivation film 1560. In addition, post pads 1621 to 1625 and wiring patterns 1631 and 1632 are formed on the insulation film 1610. Posts 1641 to 1645 are formed on the post pads 1621 to 1625. Further, a sealing film 1650 is formed on the surface of the insulation film 1610 such that only the upper surfaces of the posts 1641 to 1645 are exposed. External terminals 1661 to 1665 are provided on the exposed surfaces of the posts 1641 to 1645. The external terminals 1661 to 1665 are formed by solder, for example.

Figure 17:
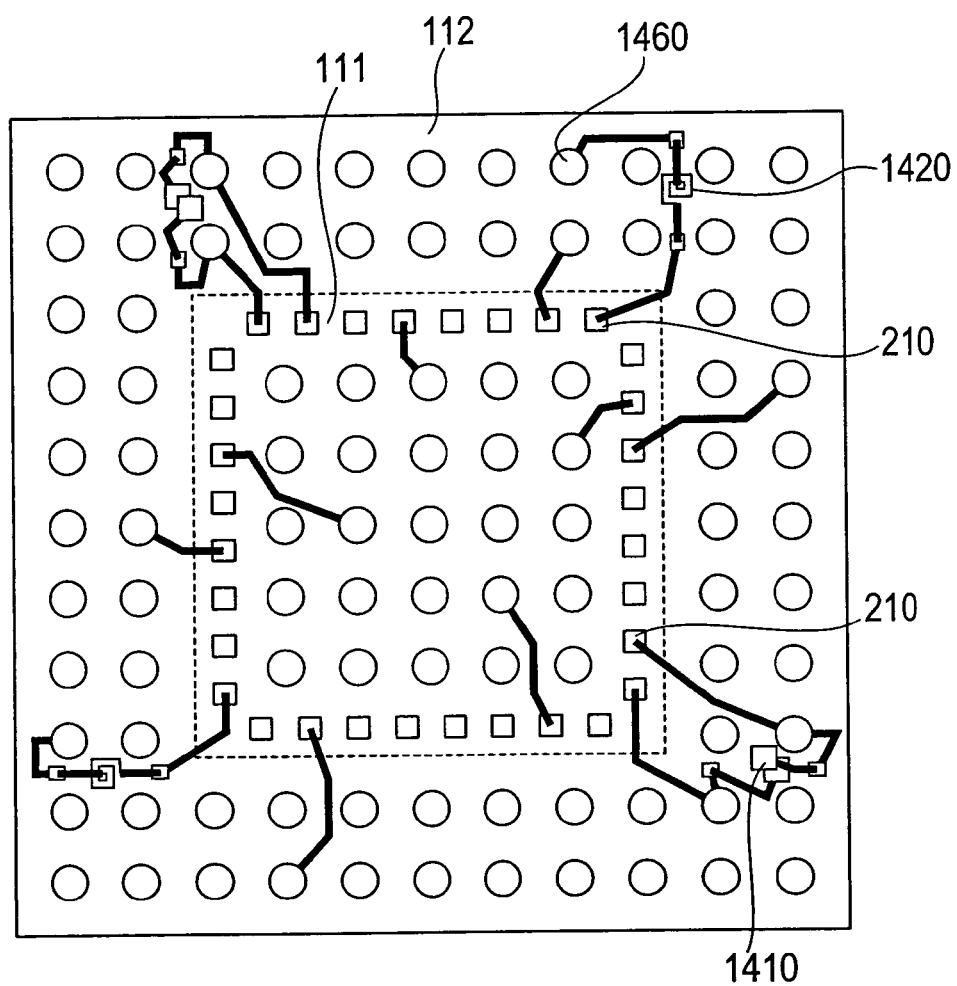
FIG. 17 is a planar view conceptually showing the mount face of the semiconductor chip according to the second embodiment.

FIG. 17 is a planar view conceptually showing the mount face of the semiconductor chip according to this embodiment. In FIG. 17, the constituent elements which have been assigned the same reference numerals as in FIG. 2 denote the same constituent elements as in FIG. 2. As can be seen from FIG. 17, according to this embodiment, the external terminals 1460 provided in the wiring region 112 are directly connected to the electrode pads 210 of the circuit region 111 or are connected to the electrode pads 210 of the circuit region 111 via the passive elements 1410 and 1420, electrode pads or other external terminals, and so forth.

Figure 18A:
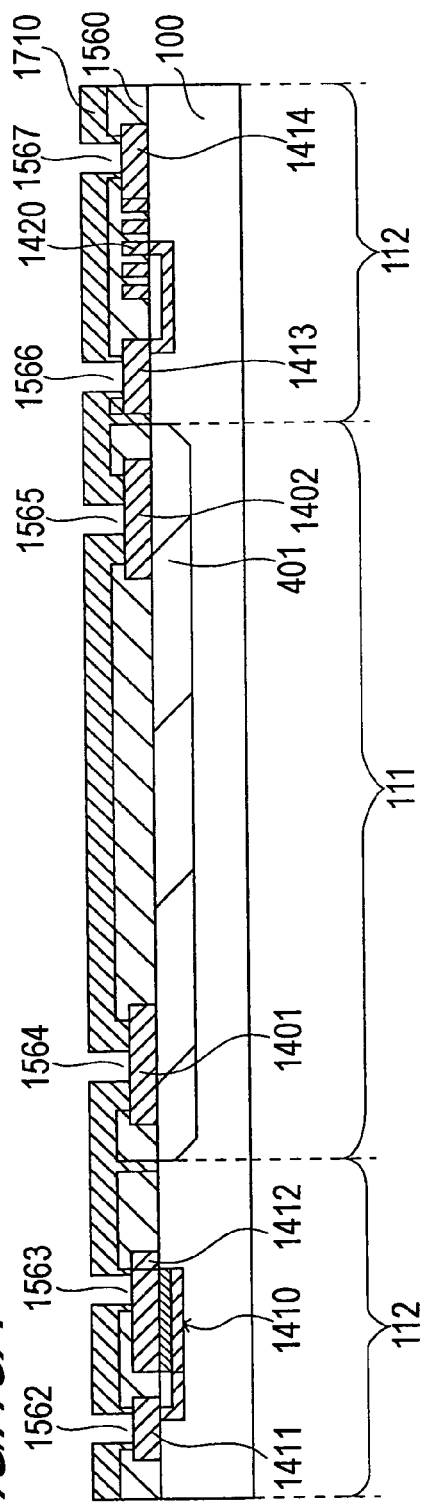
FIGS. 18A and 18B are outline cross-sectional views that serve to illustrate the fabrication process of the semiconductor device according to this embodiment.
Figure 18B:
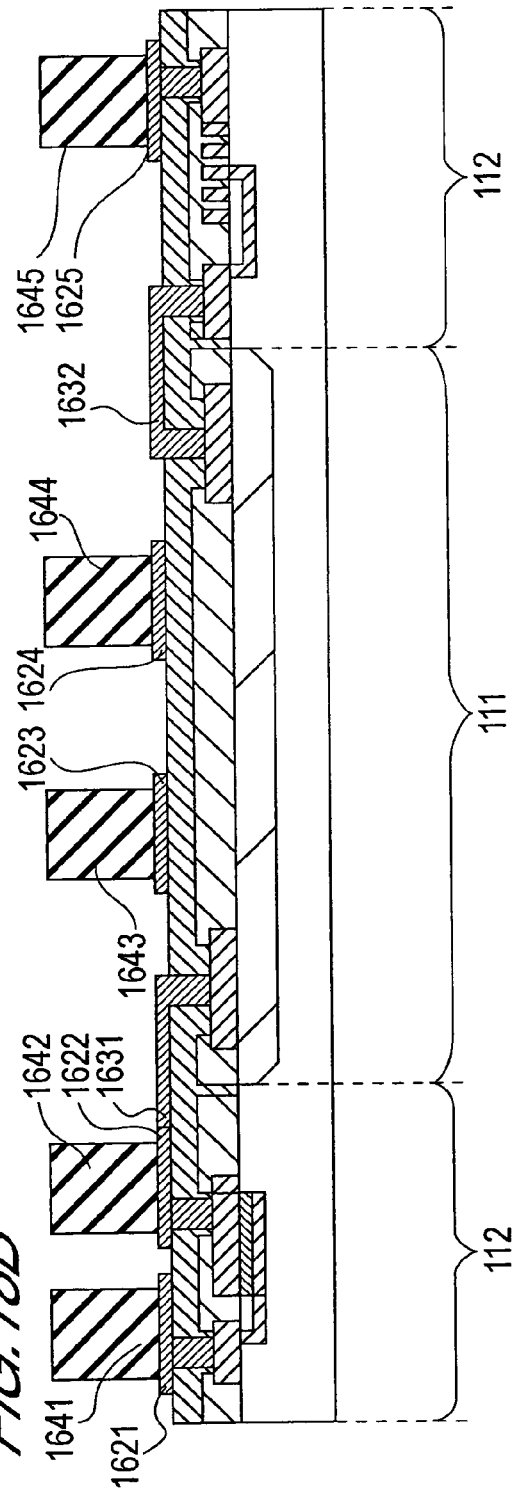

Next, the fabrication method for the semiconductor device according to this embodiment will be described by using FIGS. 18A and 18B. FIGS. 18A and 18B are outline cross-sectional views that serve to illustrate the fabrication process of the semiconductor device according to the present embodiment.

First, as shown in FIG. 18A, the integrated circuit 401 is formed in the surface of the semiconductor wafer 100 by means of an ordinary semiconductor fabrication process. In addition, the capacitor 1410 and inductor 1420 are formed by using the MEMS (Micro Electro-Mechanical System) technique, or similar, for example.

The electrode pads 1401, 1402, and 1411 to 1414 are then formed along the outer edge of the integrated circuit 401. An ordinary thin-film deposition technique and photolithographic technique, for example, are employed in the formation of the electrode pads 1401, 1402, and 1411 to 1414. An aluminum alloy or gold alloy or similar, for example, can be employed for the electrode pads 1401, 1402, and 1411 to 1414.

Next, a passivation film 1560 formed from SiN, for example, is formed over the whole surface of the semiconductor wafer 100. An ordinary thin-film deposition technique can be employed in the formation of the passivation film 1560. The film thickness of the passivation film 1560 is 0.5 to 1.0 μm, for example. The above-described grooves 1561 and openings 1562 to 1567 are formed in the passivation film 1560 by employing an ordinary photolithographic technique (See FIG. 15).

An insulation film 1710 of polyimide or similar, for example, is formed on the passivation film 1560. Spin-coating, for example, is employed as the technique for forming the insulation film 1710. The thickness of the insulation film 1710 is on the order of 10 μm, for example. Openings 1562 to 1567 are formed in the insulation film 1710 by using an ordinary photolithography technique, for example.

As shown in FIG. 18B, the post pads 1621 to 1625 and the wiring patterns 1631 and 1632 are formed as per the first embodiment. The thickness of these electrically conductive patterns 1621 to 1625, 1631 and 1632 is on the order of 5 μm, for example.

In addition, the posts 1641 to 1645 are formed on the post pads 1621 to 1625 as per the first embodiment. The diameter of the posts is on the order of 100 to 250 μm, for example.

Thereafter, a sealing film 1650 and the external terminals 1661 to 1665 are formed as per the first embodiment (See FIG. 16).

Finally, a multiplicity of semiconductor chips 200 is formed by dicing the semiconductor wafer 100.

Because, according to this embodiment, the capacitor and inductor of the wiring region 112 are formed beneath the redistribution wiring layer, the fabrication process from the redistribution wiring layer onward is straightforward.

Third Embodiment

Next, the third embodiment of the present invention will be described.

The semiconductor device according to this embodiment differs from those of the first and second embodiments above in that the capacitor and inductor are formed in the wiring region 112 in the form of an array.

Figure 19:
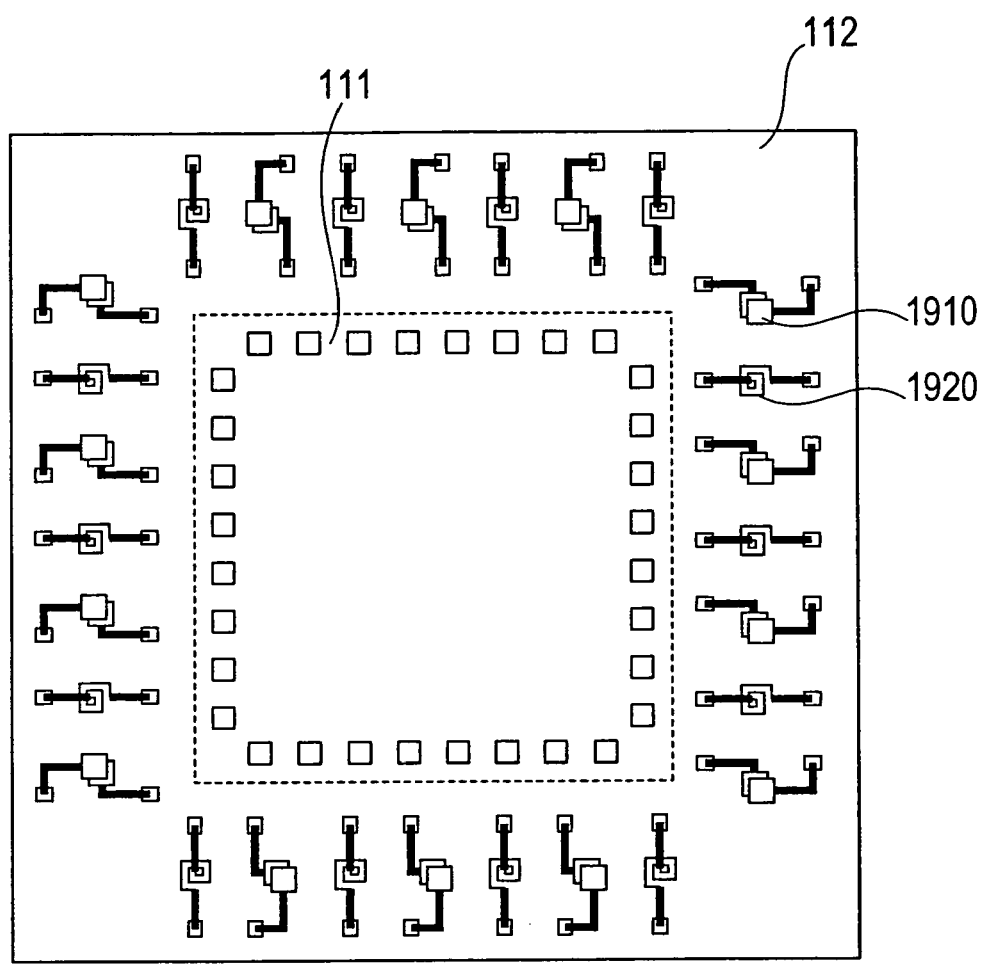
FIG. 19 is a planar view conceptually showing the semiconductor chip array formation face according to a third embodiment.

FIG. 19 is a planar view conceptually showing the semiconductor chip array formation face according to this embodiment. As shown in FIG. 19, a plurality of capacitors 1910 and a plurality of inductors 1920 are arranged alternately in the wiring region 112, for example. The passive element array is constituted by these capacitors 1910 and inductors 1920. The quantities of the capacitors 1910 and inductors 1920 and the dispositional order thereof, and so forth, can be optionally determined by the designer.

The capacitors 1910 and inductors 1920 are formed in a layer beneath the redistribution wiring layer as per the second embodiment (See FIGS. 15 and 16).

The size and characteristics of the capacitors 1910 and inductors 1920 can be standardized. The passive element array can be standardized among semiconductor chips in which the constitution of the integrated circuit 401 differs. Because the passive element array is standardized, a common mask can be employed and therefore development costs are reduced.

What is claimed is:

1. A semiconductor device fabrication method, comprising:
    providing a semiconductor wafer having a plurality of integrated circuit formation regions, each integrated circuit formation region including a circuit region in a central part thereof and a wiring region surrounding the circuit region;
    forming an integrated circuit, having a plurality of electrode pads, only in the circuit region of each of the plurality of integrated circuit formation regions, and forming a groove disposed between the circuit region and the wiring region; and
    selecting a type of package structure for the integrated circuits and performing a first fabrication process if the type of package structure selected is chip size packages, and performing a second fabrication process if the type of package structure selected is not chip size packages;
    wherein the wiring region is of sufficient width to receive therein external terminals and redistribution wiring extending to a corresponding circuit region to connect the external terminals to the electrode pads,
    wherein said first fabrication process includes for each integrated circuit formation region
        (a) forming first redistribution wiring, one end of which is connected to the electrode pads, in the circuit region, and forming second redistribution wiring, one end of which is connected to the electrode pads, at least a portion of the second redistribution wiring being disposed in the wiring region,
        (b) forming first external terminals, which are connected to the other end of the first redistribution wiring, in the circuit region, and forming second external terminals. which are connected to the other end of the second redistribution wiring, in the wiring region,
        (c) forming a sealing film which covers the circuit region and the wiring region such that the first external terminals and the second external terminals are exposed, and
        (d) completing the semiconductor device by dicing the semiconductor wafer along the outer edges of the wiring regions;
    wherein said second fabrication process includes for each integrated circuit formation region fabrication of semiconductor devices other than chip size packages, including
        (e) creating semiconductor chips by dicing the semiconductor wafer along the groove, and
        (f) completing the semiconductor devices by subjecting the semiconductor chips to predetermined packaging for the type of package structure selected,
    wherein the first fabrication process further includes forming passive elements for regulating the electrical characteristics of the second redistribution wiring in the wiring region. and wherein the passive elements include a capacitor.

2. The semiconductor device fabrication method according to claim 1, wherein the passive elements further include at least one additional capacitor, the capacitors being standardized so as to have the same size and the same characteristics.

3. The semiconductor device fabrication method according to claim 1, wherein the electrode pads are arranged along a boundary between the circuit region and the wiring region.

4. The semiconductor device fabrication method according to claim 1, wherein said selecting step includes determining to fabricate semiconductor devices other than chip-size packages.

5. The semiconductor device fabrication method according to claim 1, wherein the selecting step is conducted after the providing step and the step of forming an integrated circuit.

6. The semiconductor device fabrication method, comprising:
   providing a semiconductor wafer having a plurality of integrated circuit formation regions, each integrated circuit formation region including a circuit region in a central part thereof and a wiring region surrounding the circuit region;
   forming an integrated circuit, having a plurality of electrode pads, only in the circuit region of each of the plurality of integrated circuit formation regions, and forming a groove disposed between the circuit region and the wiring region; and
   selecting a type of package structure for the integrated circuits and performing a first fabrication process if the type of package structure selected is chip size packages, and performing a second fabrication process if the type of package structure selected is not chip size packages;
   wherein the wiring region is of sufficient width to receive therein external terminals and redistribution wiring extending to a corresponding circuit region to connect the external terminals to the electrode pads,
   wherein said first fabrication process includes for each integrated circuit formation region
     (a) forming first redistribution wiring, one end of which is connected to the electrode pads, in the circuit region, and forming second redistribution wiring, one end of which is connected to the electrode pads, at least a portion of the second redistribution wiring being disposed in the wiring region,
     (b) forming first external terminals, which are connected to the other end of the first redistribution wiring, in the circuit region, and forming second external terminals, which are connected to the other end of the second redistribution wiring, in the wiring region,
     (c) forming a sealing film which covers the circuit region and the wiring region such that the first external terminals and the second external terminals are exposed, and
     (d) completing the semiconductor device by dicing the semiconductor wafer along the outer edges of the wiring regions;
   wherein said second fabrication process includes for each integrated circuit formation region fabrication of semiconductor devices other than chip size packages, including
     (e) creating semiconductor chips by dicing the semiconductor wafer along the groove, and
     (f) completing the semiconductor devices by subjecting the semiconductor chips to predetermined packaging for the type of package structure selected,
   wherein the first fabrication process further includes forming passive elements for regulating the electrical characteristics of the second redistribution wiring in the wiring region, and wherein the passive elements include an inductor.

7. The semiconductor device fabrication method according to claim 6, wherein the passive elements further include at least one additional inductor, the inductors being standardized so as to have the same size and the same characteristics.

8. The semiconductor device fabrication method according to claim 6, wherein the electrode pads are arranged along a boundary between the circuit region and the wiring region.

9. The semiconductor device fabrication method according to claim 6, wherein said selecting step includes determining to fabricate semiconductor devices other than chip-size packages.

10. The semiconductor device fabrication method according to claim 6, wherein the selecting step is conducted after the providing step and the step of forming an integrated circuit.

11. A semiconductor device fabrication method, comprising:
   providing a semiconductor wafer having a plurality of integrated circuit formation regions, each integrated circuit formation region including a circuit region in a central part thereof and a wiring region surrounding the circuit region;
   forming an integrated circuit, having a plurality of electrode pads, only in the circuit region of each of the plurality of integrated circuit formation regions, and forming a groove disposed between the circuit region and the wiring region; and
   selecting a type of package structure for the integrated circuits and performing a first fabrication process if the type of package structure selected is chip size packages, and performing a second fabrication process if the type of package structure selected is not chip size packages;
   wherein the wiring region is of sufficient width to receive therein external terminals and redistribution wiring extending to a corresponding circuit region to connect the external terminals to the electrode pads,
   wherein said first fabrication process includes for each integrated circuit formation region
     (a) forming first redistribution wiring, one end of which is connected to the electrode pads, in the circuit region, and forming second redistribution wiring, one end of which is connected to the electrode pads, at least a portion of the second redistribution wiring being disposed in the wiring region,
     (b) forming first external terminals, which are connected to the other end of the first redistribution wiring, in the circuit region, and forming second external terminals, which are connected to the other end of the second redistribution wiring, in the wiring region,
     (c) forming a sealing film which covers the circuit region and the wiring region such that the first external terminals and the second external terminals are exposed, and
     (d) completing the semiconductor device by dicing the semiconductor wafer along the outer edges of the wiring regions;
   wherein said second fabrication process includes for each integrated circuit formation region fabrication of semiconductor devices other than chip size packages, including
     (e) creating semiconductor chips by dicing the semiconductor wafer along the groove, and
     (f) completing the semiconductor devices by subjecting the semiconductor chips to predetermined packaging for the type of package structure selected,
   wherein the first fabrication process further includes forming passive elements for regulating the electrical characteristics of the second redistribution wiring in the wiring region, and wherein the passive elements are arranged in the form of an array in the wiring region.

12. A semiconductor device fabrication method, comprising:
   providing a semiconductor wafer having a plurality of integrated circuit formation regions, each integrated circuit formation region including a circuit region in a central part thereof and a wiring region surrounding the circuit region;
   forming an integrated circuit, having a plurality of electrode pads, only in the circuit region of each of the plurality of integrated circuit formation regions, and forming a groove disposed between the circuit region and the wiring region; and
   selecting a type of package structure for the integrated circuits and performing a first fabrication process if the type of package structure selected is chip size packages, and performing a second fabrication process if the type of package structure selected is not chip size packages;
   wherein the wiring region is of sufficient width to receive therein external terminals and redistribution wiring extending to a corresponding circuit region to connect the external terminals to the electrode pads,
   wherein said first fabrication process includes for each integrated circuit formation region
      (a) forming first redistribution wiring, one end of which is connected to the electrode pads, in the circuit region, and forming second redistribution wiring, one end of which is connected to the electrode pads, at least a portion of the second redistribution wiring being disposed in the wiring region,
      (b) forming first external terminals, which are connected to the other end of the first redistribution wiring, in the circuit region, and forming second external terminals, which are connected to the other end of the second redistribution wiring, in the wiring region,
      (c) forming a sealing film which covers the circuit region and the wiring region such that the first external terminals and the second external terminals are exposed, and
      (d) completing the semiconductor device by dicing the semiconductor wafer along the outer edges of the wiring regions;
   wherein said second fabrication process includes for each integrated circuit formation region fabrication of semiconductor devices other than chip size packages, including
      (e) creating semiconductor chips by dicing the semiconductor wafer along the groove, and
      (f) completing the semiconductor devices by subjecting the semiconductor chips to predetermined packaging for the type of package structure selected,
   wherein the first fabrication process further includes forming passive elements for regulating the electrical characteristics of the second redistribution wiring in the wiring region, and
   wherein the passive elements are formed in the layer in which the second redistribution wiring is provided.

13. A semiconductor device fabrication method, comprising:
   providing a semiconductor wafer having a plurality of integrated circuit formation regions, each integrated circuit formation region including a circuit region in a central part thereof and a wiring region surrounding the circuit region;
   forming an integrated circuit, having a plurality of electrode pads, only in the circuit region of each of the plurality of integrated circuit formation regions, and forming a groove disposed between the circuit region and the wiring region; and
   selecting a type of package structure for the integrated circuits and performing a first fabrication process if the type of package structure selected is chip size packages, and performing a second fabrication process if the type of package structure selected is not chip size packages;
   wherein the wiring region is of sufficient width to receive therein external terminals and redistribution wiring extending to a corresponding circuit region to connect the external terminals to the electrode pads,
   wherein said first fabrication process includes for each integrated circuit formation region
      (a) forming first redistribution wiring, one end of which is connected to the electrode pads, in the circuit region, and forming second redistribution wiring, one end of which is connected to the electrode pads, at least a portion of the second redistribution wiring being disposed in the wiring region,
      (b) forming first external terminals, which are connected to the other end of the first redistribution wiring, in the circuit region, and forming second external terminals, which are connected to the other end of the second redistribution wiring, in the wiring region,
      (c) forming a sealing film which covers the circuit region and the wiring region such that the first external terminals and the second external terminals are exposed, and
      (d) completing the semiconductor device by dicing the semiconductor wafer along the outer edges of the wiring regions,
   wherein said second fabrication process includes for each integrated circuit formation region fabrication of semiconductor devices other than chip size packages, including
      (e) creating semiconductor chips by dicing the semiconductor wafer along the groove, and
      (f) completing the semiconductor devices by subjecting the semiconductor chips to predetermined packaging for the type of package structure selected,
   wherein the first fabrication process further includes forming passive elements for regulating the electrical characteristics of the second redistribution wiring in the wiring region, and
   wherein the passive elements are formed in a layer that lies beneath the layer in which the second redistribution wiring is provided.

14. A semiconductor device fabrication method for fabricating semiconductor devices having integrated circuits with predetermined circuitry, comprising:
   (a) providing a semiconductor wafer having a predetermined number of integrated circuit formation regions, each integrated circuit formation region including a circuit region in a central part thereof and a peripheral wiring region surrounding the circuit region;
   (b) forming the predetermined circuitry, including a plurality of electrode pads, in the circuit region of each of the integrated circuit formation regions and forming a groove disposed between the circuit region and the wiring region; and
   (c) forming the semiconductor devices by the substeps of
      (i) creating semiconductor chips by dicing the semiconductor wafer along the grooves; and
      (ii) completing the semiconductor devices by subjecting the semiconductor chips to predetermined packaging, wherein the peripheral wiring regions are wide enough to accommodate external terminals for connection to the electrode pads by redistribution wiring, if the semiconductor wafer had been diced between the integrated circuit formation regions instead of along the grooves, wherein the wafer is a first wafer and chip size packages are selected for completing the semiconductor devices in step (c) (ii), and wherein the method further comprises:

(d) providing a second semiconductor wafer that is substantially the same as the first semiconductor wafer;

(e) forming the predetermined circuitry on the second semiconductor wafer;

(f) forming further semiconductor devices by the substeps of (i) creating further semiconductor chips by dicing the second wafer; and (ii) completing the further semiconductor devices, step (f)(ii) including packaging the further semiconductor devices in packages that are not chip size packages.

15. A semiconductor fabrication method, comprising:

providing a semiconductor wafer having a plurality of integrated circuit formation regions, each integrated circuit formation region including a circuit region in a central part thereof and a wiring region surrounding the circuit region, a groove being disposed between the circuit region and the wiring region;

forming an integrated circuit, having a plurality of electrode pads, only in the circuit region of each of the plurality of integrated circuit formation regions; and selecting a type of package structure for the integrated circuits and performing a first fabrication process if the type of package structure selected is chip size packages, and performing a second fabrication process if the type of package structure selected is not chip size packages;

wherein the wiring region is of sufficient width to receive therein external terminals and redistribution wiring extending to a corresponding circuit region to connect the external terminals to the electrode pads, wherein said first fabrication process includes for each integrated circuit formation region (a) forming first redistribution wiring, one end of which is connected to the electrode pads, in the circuit region, and forming second redistribution wiring, one end of which is connected to the electrode pads, at least a portion of the second redistribution wiring being disposed in the wiring region, (b) forming first external terminals, which are connected to the other end of the first redistribution wiring, in the circuit region, and forming second external terminals, which are connected to the other end of the second redistribution wiring, in the wiring region, (c) forming a sealing film which covers the circuit region and the wiring region such that the first external terminals and the second external terminals are exposed, and (d) completing the semiconductor device by dicing the semiconductor wafer along the outer edges of the circuit regions;

wherein said second fabrication process includes for each integrated circuit formation region fabrication of semiconductor devices other than chip size packages, including (e) creating semiconductor chips by dicing the semiconductor wafer along the groove, and (f) completing the semiconductor devices by subjecting the semiconductor chips to predetermined packaging for the type of package structure selected, wherein the wafer is a first wafer, the integrated circuit is a first integrated circuit, the selecting step is a first selecting step, and the type of package structure selected in the first selecting step is chip size packages, and wherein the method further comprises:

providing a second semiconductor wafer that is substantially the same as the first semiconductor wafer;

forming a second integrated circuit on the second wafer, the second integrated circuit being substantially the same as the first integrated circuit;

conducting a second selecting step in which the type of package structure selected is not chip size packages; and performing the second fabrication process.

16. A semiconductor fabrication method for fabricating on a semiconductor wafer either of first and second pluralities of semiconductor devices, the devices of the first plurality being chip size package semiconductor devices, the devices of the second plurality being other than chip size package semiconductor devices, the number of semiconductor devices to be fabricated on the semiconductor wafer being a predetermined number that is the same irrespective of whether they are chip size package semiconductor devices or other than chip size package semiconductor devices, the method comprising:

providing the semiconductor wafer, the semiconductor wafer having a plurality of integrated circuit formation regions equal in number to said predetermined number, each integrated circuit formation region including a circuit region in a central part thereof and a wiring region surrounding the circuit region;

forming an integrated circuit, having a plurality of electrode pads, in the circuit region of each of the plurality of integrated circuit formation regions; and determining whether to fabricate chip size package semiconductor devices, and if so performing a first fabrication process, and if not, performing a second fabrication process;

wherein the wiring region is of sufficient width to receive therein external terminals and redistribution wiring to connect the external terminals to the electrode pads, wherein said first fabrication process includes for each integrated circuit formation region (a) forming first redistribution wiring in the circuit region and connecting first ends thereof to the electrode pads, and forming second redistribution wiring in the wiring region and connecting first ends thereof to the electrode pads, at least part of the second redistribution wiring being disposed in the wiring region, (b) forming first external terminals in the circuit region, and connecting them to the second ends of the first redistribution wiring, and forming second external terminals in the wiring region, and connecting them to second ends of the second redistribution wiring, (c) forming a sealing film which covers the circuit region and the wiring region such that the first external terminals and the second external terminals are exposed, and (d) completing the chip size package semiconductor device by dicing the semiconductor wafer along the outer edge of the wiring region; and wherein said second fabrication process includes for each integrated circuit formation region fabrication of semi conductor devices other than chip size packages, including
(e) creating the predetermined number of semiconductor chips by dicing the semiconductor wafer along the outer edges of the circuit regions to separate the circuit regions from the wiring regions, and
(f) completing the semiconductor devices by subjecting the semiconductor chips to predetermined packaging,
wherein the determining step is conducted after the providing step and the step of forming an integrated circuit, wherein the wafer is a first wafer, the integrated circuit is a first integrated circuit, the determining step is a first determining step, and the first determining step results in a determination to fabricate chip size package semiconductor devices, and
wherein the method further comprises:
providing a second semiconductor wafer that is substantially the same as the first semiconductor wafer;
forming a second integrated circuit on the second wafer, the second integrated circuit being substantially the same as the first integrated circuit;
conducting a second determining step in which a determination is made not to fabricate chip size package semiconductor devices; and performing the second fabrication process.

* * * * *